US010410878B2

(12) United States Patent
Sun et al.

(10) Patent No.: US 10,410,878 B2
(45) Date of Patent: Sep. 10, 2019

(54) HYDROFLUOROCARBONS CONTAINING —$NH_2$ FUNCTIONAL GROUP FOR 3D NAND AND DRAM APPLICATIONS

(71) Applicants: American Air Liquide, Inc., Fremont, CA (US); Air Liquide Electronics U.S. LP, Dallas, TX (US); L'Air Liquide, Société Anonyme pour l'Etude et l'Exploitation des Procédés Georges Claude, Paris (FR)

(72) Inventors: Hui Sun, Newark, DE (US); Fabrizio Marchegiani, Bear, DE (US); James Royer, Bear, DE (US); Nathan Stafford, Damascus, OR (US); Rahul Gupta, St. Louis, MO (US)

(73) Assignees: American Air Liquide, Inc., Fremont, CA (US); Air Liquide Electronics US. LP, Dallas, TX (US); L'Air Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 0 days.

(21) Appl. No.: 15/798,476

(22) Filed: Oct. 31, 2017

(65) Prior Publication Data
US 2019/0131140 A1 May 2, 2019

(51) Int. Cl.
*C09K 13/00* (2006.01)
*H01L 21/027* (2006.01)
(Continued)

(52) U.S. Cl.
CPC ........ *H01L 21/31116* (2013.01); *C09K 13/00* (2013.01); *H01L 21/0273* (2013.01);
(Continued)

(58) Field of Classification Search
CPC .......... H01L 21/31116; H01L 21/0273; H01L 21/31144; H01L 27/11556; H01L 27/11582; C09K 13/00
See application file for complete search history.

(56) References Cited

U.S. PATENT DOCUMENTS 6,013,582 A 1/2000 Ionov et al.
6,495,469 B1 * 12/2002 Yang ................ H01L 21/31116
257/E21.029
(Continued)

FOREIGN PATENT DOCUMENTS

EP 1 235 265 8/2002
JP H10 303181 11/1998
(Continued)

OTHER PUBLICATIONS

International Search Report and Written Opinion for corresponding PCT/US2018/058472, dated Feb. 12, 2019.

*Primary Examiner* — Anita K Alanko
(74) *Attorney, Agent, or Firm* — Yan Jiang

(57) ABSTRACT

A method for using a hydrofluorocarbon etching compound selected from the group consisting of 2,2,2-Trifluoroethanamine ($C_2H_4F_3N$), 1,1,2-Trifluoroethan-1-amine (Iso-$C_2H_4F_3N$), 2,2,3,3,3-Pentafluoropropylamine ($C_3H_4F_5N$), 1,1,1,3,3-Pentafluoro-2-Propanamine (Iso-$C_3H_4F_5N$), 1,1,1,3,3-Pentafluoro-(2R)-2-Propanamine (Iso-2R—$C_3H_4F_5N$) and 1,1,1,3,3-Pentafluoro-(2S)-2-Propanamine (Iso-2S—$C_3H_4F_5N$), 1,1,1,3,3,3-Hexafluoroisopropylamine ($C_3H_3F_6N$) and 1,1,2,3,3,3-Hexafluoro-1-Propanamine (Iso-$C_3H_3F_6N$) to selectively plasma etching silicon containing films, such as a dielectric antireflective coat (DARC) layer (e.g., SiON), alternating SiO/SiN layers, alternating SiO/p-Si layers, versus a photoresist layer and/or a hard mask layer (e.g., amorphous carbon layer), wherein the photoresist layer
(Continued)

is reinforced and SiO/SiN and/or SiO/p-Si are etched non-selectively.

20 Claims, 23 Drawing Sheets

(51) Int. Cl.
    *H01L 21/311*      (2006.01)
    *H01L 27/11556*    (2017.01)
    *H01L 27/11582*    (2017.01)

(52) U.S. Cl.
    CPC ... *H01L 21/31144* (2013.01); *H01L 27/11556* (2013.01); *H01L 27/11582* (2013.01)

(56) References Cited

U.S. PATENT DOCUMENTS

| | | |
|---|---|---|
| 6,569,774 B1 | 5/2003 | Trapp |
| 7,153,779 B2 | 12/2006 | Trapp |
| 9,659,788 B2 | 5/2017 | Surla et al. |
| 2011/0253670 A1 | 10/2011 | Zhou et al. |
| 2013/0069246 A1 | 3/2013 | Bae et al. |
| 2015/0371869 A1* | 12/2015 | Surla ................ H01L 21/31116 438/723 |
| 2017/0110336 A1* | 4/2017 | Hsu .................. H01L 21/31116 |

FOREIGN PATENT DOCUMENTS

| | | |
|---|---|---|
| JP | 2001 077085 | 3/2001 |
| KR | 2000 0004363 | 1/2000 |
| KR | 2000 0027930 | 5/2000 |
| KR | 2009 0090456 | 8/2009 |
| KR | 2010 0070231 | 6/2010 |

* cited by examiner

FLAT: O₂= 2 sccm

ROUGH: O₂= 0 sccm

FLAT: O2= 16 sccm

ROUGH: O2= 15 sccm

US 10,410,878 B2

HYDROFLUOROCARBONS CONTAINING —NH$_2$ FUNCTIONAL GROUP FOR 3D NAND AND DRAM APPLICATIONS

TECHNICAL FIELD

Disclosed are nitrogen-containing hydrofluorocarbon etching compounds for plasma etching of silicon-containing films in semiconductor device etch applications and plasma etching methods of using the same, in particular for selectively plasma etching of a dielectric anti-reflective coating (DARC) layer (e.g., a SiON layer) over a patterned photoresist layer and selectively plasma etching of alternating layers of SiO/SiN layers and alternating layers of SiO/p-Si silicon layers versus a hard mask layer for 3D NAND and DRAM applications.

BACKGROUND

With semiconductor architectures becoming more and more small and complex, 3D structured NAND has been highly desirable as memory cells are stacked on top of each other to increase capacity through higher density, lower cost per gigabyte, and offer the reliability, speed and performance expected of solid-state memory. In the field of 3D NAND fabrication, generally, photoresists are applied over a stack of layers of various materials to be patterned in subsequent processing steps. To take advantage of the spatial resolution of the photoresists, it is necessary to use an anti-reflective coating (ARC) layer underlying the photoresist, to suppress reflection off other layers in the stack during photoresist exposure. The ARC layer typically refers to one or multiple layers of ARC, for example, a bottom anti-reflective coating (BARC) layer formed of organic compositions and a dielectric anti-reflective coating (DARC) layer formed of inorganic compositions. Recently there has been increased interest in the use of silicon oxynitride (SiON) as an inorganic DARC, due to its ability to function well in combination with deep ultraviolet (UV) photoresists.

In 3D NAND applications, the thickness of the SiON layer below PR mask layer for lithography purpose is increased due to more and more layers of various materials to be patterned added below the SiON layer. The PR mask layer typically is a spin-on material consisting of C, H and O element, which is easily damaged by plasma. Traditional dry etch gases, such as CF$_4$, CHF$_3$, C$_4$F$_8$ or C$_4$F$_6$ has limited SiON/PR selectivity. These gases tend to etch isotropically, and create overhanging/damage on the PR mask layer; hence the damages on PR or the structure changes on the PR will affect the subsequent etching steps. Thus achieving high selectivity of SiON/PR with minimum PR deformation is challenging and has attracted significant attention from industry.

Attempts have been performed to inhibit damage of the PR mask layer during etching processes under plasma etching conditions, that is, to improve the selectivity of the DARC layer to photoresist layer.

Hydrofluorocarbons or fluorocarbons have been used to etch the DARC layer and the dielectric layer over which a photoresist layer is deposited. For example, U.S. Pat. No. 6,495,469 to Yang et al. disclose etching a DARC layer employing a CH$_3$F, CH$_2$F$_2$, or CHF$_3$ with O$_2$/N$_2$/Ar improves a selectivity of the DARC layer and the dielectric layer to photoresist layer from about 0.87 to 2.45.

Furthermore, stacks of silicon oxide and silicon nitride (SiO/SiN or ON) and silicon oxide and polysilicon (SiO/p-Si or OP) are important compositions of tunnel and charge trapping in NAND type flash memory. Etching of stacks of multiple SiO/SiN or SiO/p-Si layers is critical in 3D NAND applications. The challenge of etching 3D NAND is that how to etch oxide and nitride layers or oxide and polysilicon (p-Si) layers with a similar etch rate as high as possible. In addition, the etched structure should have a straight vertical profile without bowing and low line etch roughness (LER).

Traditional etch gases for etching SiO/SiN or SiO/p-Si layers include cC$_4$H$_8$, C$_4$F$_6$, CF$_4$, CH$_2$F$_2$, CH$_3$F, and/or CHF$_3$. It is known that selectivity and polymer deposition rate increase as the ratio of C:F increases (i.e., C$_4$F$_6$>C$_4$F$_8$>CF$_4$). Traditional etch chemistries may not be able to provide a feature, such as a hole or trench, having an aspect ratio higher that 20:1, which is necessary in the newer applications (e.g., 3D NAND), at least due to insufficient etch resistant polymer deposition on sidewalls during the plasma etching processes. The sidewall —C$_x$F$_y$— polymers, wherein x ranges from 0.01 to 1 and y ranges from 0.01 to 4, may be susceptible to etching. As a result, the etched patterns may not be vertical and the etch structure may show bowing, change in dimensions, pattern collapse and/or increased roughness.

Nitrogen containing compounds have been used as etching gases. For example, U.S. Pat. Nos. 6,569,774 and 7,153,779 to Trapp disclose plasma etch process for forming a high aspect ratio contact opening through a silicon oxide layer. At least one etch gas is used that includes one or more nitrogen-comprising gases to deposit a polymeric surface material during the etching for maintaining a masking layer over the silicon oxide layer. A list of hydrofluorocarbon and fluorocarbon containing —NH$_2$ chemistries are disclosed, but no structural formulae, CAS numbers, or isomer information are provided. U.S. Pat. No. 9,659,788 to Surla et al. discloses nitrogen-containing using —NH$_2$ containing etching gas for plasma etching silicon-containing films, in which 1,1,1,3,3,3-Hexafluoroisopropylamine (C$_3$H$_3$F$_6$N) is disclosed to offer sidewall protection and good selectivity to p-Si and a-C but lose selectivity to SiN film even without any oxygen addition.

Up to now, using nitrogen-containing hydrofluorocarbons to etch both DARC layer and the stacks of silicon-containing layers has not been found. There is, therefore, a need to develop new etch gas compositions for use in patterning a stack of layers of various materials in plasma etching applications, which may provide high selectivity of the DARC layer versus the PR mask layer and the silicon-containing layers versus a-C layer and maintain high aspect ratio for a wide range of process conditions.

SUMMARY

Disclosed are methods for etching a structure of silicon-containing layers disposed over a substrate, the structure having a dielectric anti-reflective coating (DARC) layer deposited over alternating layers of a first silicon-containing layer and a second silicon-containing layer, a patterned photoresist layer formed over the DARC layer, and a hardmask layer formed in between the DARC layer and the alternating layers, the method comprising the steps of selectively plasma etching the DARC layer versus the patterned photoresist layer using a hydrofluorocarbon etching compound selected from the group consisting of 2,2,2-Trifluoroethanamine (C$_2$H$_4$F$_3$N) and 2,2,3,3,3-Pentafluoropropylamine (C$_3$H$_4$F$_5$N) to produce apertures in the DARC layer, selectively plasma etching the hardmask layer exposed by the apertures in the DARC layer versus the patterned photoresist layer and the DARC layer with an etching gas suitable for etching the hardmask layer to extend the apertures through the hardmask layer, and selectively plasma etching the alternating layers exposed by the apertures in the hardmask layer versus the hardmask layer using the hydrofluorocarbon etching compound to extend the apertures through the alternating layers, wherein the first silicon-containing layer and the second silicon-containing layer are etched non-selectively.

Also, disclosed are methods for etching a structure of silicon-containing layers disposed over a substrate, the structure having a DARC layer deposited over alternating layers of silicon oxide and silicon nitride, a patterned photoresist layer formed over the DARC layer, and a hardmask layer formed in between the DARC layer and the alternating layers, the method comprising the steps of selectively plasma etching the DARC layer versus the patterned photoresist layer using 1,1,1,3,3,3-Hexafluoroisopropylamine ($C_3H_3F_6N$) to produce apertures in the DARC layer, selectively plasma etching the hardmask layer exposed by the apertures in the DARC layer versus the patterned photoresist layer and the DARC layer with an etching gas suitable for etching the hardmask layer to extend the apertures through the hardmask layer, and selectively plasma etching the alternating layers of silicon oxide and silicon nitride exposed by the apertures in the hardmask layer versus the hardmask layer using 1,1,1,3,3,3-Hexafluoroisopropylamine ($C_3H_3F_6N$) to extend the apertures in the alternating layers of silicon oxide and silicon nitride, wherein the silicon oxide layer and the silicon nitride layer are etched non-selectively.

Either of the disclosed methods may include one or more of the following aspects:

the hydrofluorocarbon etching compound being a nitrogen-containing hydrofluorocarbon compound;
the hydrofluorocarbon etching compound being a nitrogen-containing organofluorine compound;
the hydrofluorocarbon etching compound containing a —$NH_2$ functional group at the terminal carbon;
the hydrofluorocarbon etching compound containing a —$NH_2$ functional group not at the terminal carbon;
the hydrofluorocarbon etching compound containing one nitrogen;
the plasma activated hydrofluorocarbon etching compound reacting with the silicon-containing film to form volatile by-products;
the volatile by-products being removed from the reaction chamber;
the DARC layer being a silicon-containing film;
the silicon-containing film comprising oxygen, nitrogen, carbon, hydrogen, carbon or combinations thereof;
the silicon-containing film being $SiO_xN_yH_zC_k$, wherein x ranges from 0 to 2, y ranges from 0 to 1, z ranges from 0 to about 1 and k ranges from 0 to 1;
the silicon-containing film comprising a SiON layer;
the silicon-containing film being a SiON layer;
the DARC layer comprising a SiON layer;
the DARC layer being a SiON layer;
the SiON layer being selectively etched from the patterned photoresist layer;
selectively etching the SiON layer from the patterned photoresist layer;
depositing a BARC layer over the DARC layer;
the BARC layer comprising polyamides and polysulfones;
selectively plasma etching the BARC layer versus the patterned photoresist layer;
the patterned photoresist layer being formed of photoresist resins including ester groups that contain a tertiary non-cyclic alkyl carbon or a tertiary alicyclic carbon covalently linked to the carboxyl oxygen of the ester, acetal photoacid-labile groups, an amine-based cross-linking component, or a phenolic resin for use as a resin binder;
the patterned photoresist layer being formed of a cross-linking component including an amine-based cross-linker, a resin binder and a photoactive component;
the alternating layers comprising a layer of silicon oxide, silicon nitride, polysilicon, crystalline silicon, SiOCH, SiON, $Si_aO_bC_cN_dH_e$ (where a>0; b, c, d and e≥0) or combinations thereof;
the alternating layers comprising oxygen atoms, nitrogen atoms, carbon atoms, hydrogen atoms or combinations thereof;
the alternating layers being a silicon containing film;
the alternating layers comprising a layer of silicon oxide and a layer of silicon nitride;
the alternating layers comprising alternating layers of silicon oxide and silicon nitride;
the alternating layers being alternating layers of silicon oxide and silicon nitride;
the alternating layers comprising a layer of silicon oxide and a layer of polysilicon;
the alternating layers comprising alternating layers of silicon oxide and polysilicon;
the alternating layers being alternating layers of silicon oxide and polysilicon;
the first silicon-containing layer comprising a silicon oxide layer;
the first silicon-containing layer comprising a silicon nitride layer;
the first silicon-containing layer comprising a polysilicon layer;
the second silicon-containing layer comprising a silicon oxide layer;
the second silicon-containing layer comprising a silicon nitride layer;
the second silicon-containing layer comprising a polysilicon layer;
depositing a hardmask layer over the alternating layers;
the hardmask layer selected from the group consisting of a thermal deposition process CVD, a plasma enhanced process PECVD or spray on/spin on deposited layer of amorphous carbon (a-C), doped a-C, such as amorphous carbon doped with boron, nitrogen, sulfur, chlorine, fluorine or metals (Al, Zr, Ti, W), silicon-containing spin on mask, and carbon-containing spin on mask;
the hardmask layer being an a-C layer;
the hardmask layer being a doped a-C layer;
the hardmask layer being a silicon-containing spin on mask layer;
the hardmask layer being a carbon-containing spin on mask layer;
the hardmask layer being selectively etched from the patterned photoresist layer and the DARC layer;
selectively plasma etching the hardmask layer versus the patterned photoresist layer and the DARC layer;
the hardmask layer being etched by the etching gas selected from the group consisting of $cC_4F_8$, $C_4F_8$, $C_4F_6$, $C_5F_8$, $CF_4$, $CH_3F$, $CF_3H$, $CH_2F_2$, COS, $CS_2$, $CF_3I$, $C_2F_3I$, $C_2F_5I$, CFN, FNO, $SO_2$ and combination thereof;
the alternating layers being selectively etched from the hardmask layer;

the alternating layers being selectively etched from an a-C layer;
the alternating layers being selectively etched from a doped a-C layer;
the alternating layers being selectively etched from a silicon-containing spin on hardmask layer;
the alternating layers being selectively etched from a carbon-containing spin on hardmask layer;
the alternating layers of silicon oxide and silicon nitride being selectively etched from the hardmask layer;
the alternating layers of silicon oxide and silicon nitride being selectively etched from an a-C layer;
the alternating layers of silicon oxide and silicon nitride being selectively etched from a doped a-C layer;
the alternating layers of silicon oxide and silicon nitride being selectively etched from a silicon-containing spin on hardmask layer;
the alternating layers of silicon oxide and silicon nitride being selectively etched from a carbon-containing spin on hardmask layer;
the alternating layers of silicon oxide and polysilicon being selectively etched from the hardmask layer;
the alternating layers of silicon oxide and polysilicon being selectively etched from an a-C layer;
the alternating layers of silicon oxide and polysilicon being selectively etched from a doped a-C layer;
the alternating layers of silicon oxide and polysilicon being selectively etched from a silicon-containing spin on hardmask layer;
the alternating layers of silicon oxide and polysilicon being selectively etched from a carbon-containing spin on hardmask layer;
the silicon oxide layer being selectively etched from the hardmask layer;
the silicon oxide layer being selectively etched from an a-C layer;
the silicon oxide layer being selectively etched from a doped a-C layer;
the silicon oxide layer being selectively etched from a silicon-containing spin on hardmask layer;
the silicon oxide layer being selectively etched from a carbon-containing spin on hardmask layer;
the silicon nitride layer being selectively etched from the hardmask layer;
the silicon nitride layer being selectively etched from an a-C layer;
the silicon nitride layer being selectively etched from a doped a-C layer;
the silicon nitride layer being selectively etched from a silicon-containing spin on hardmask layer;
the silicon nitride layer being selectively etched from a carbon-containing spin on hardmask layer;
the polysilicon layer being selectively etched from the hardmask layer;
the polysilicon layer being selectively etched from an a-C layer;
the polysilicon layer being selectively etched from a doped a-C layer;
the polysilicon layer being selectively etched from a silicon-containing spin on hardmask layer;
the polysilicon layer being selectively etched from a carbon-containing spin on hardmask layer;
the silicon oxide layer being not selectively etched from the silicon nitride layer;
the silicon oxide layer being not selectively etched from the polysilicon layer;
the silicon nitride layer being not selectively etched from the silicon oxide layer;
the polysilicon layer being not selectively etched from the silicon oxide layer;
producing the apertures having an aspect ratio between approximately 10:1 and approximately 200:1;
producing the apertures in the silicon-containing films having an aspect ratio between approximately 10:1 and approximately 200:1;
producing the apertures in the SiON layer having an aspect ratio between approximately 10:1 and approximately 200:1;
producing the apertures in the alternating layers having an aspect ratio between approximately 10:1 and approximately 200:1;
producing the apertures in the alternating layers of SiO and SiN layers having an aspect ratio between approximately 10:1 and approximately 200:1;
producing the apertures in the alternating layers of SiO and p-Si layers having an aspect ratio between approximately 10:1 and approximately 200:1;
a polymer layer being formed on the patterned photoresist layer and the sidewall of the apertures;
the plasma activated hydrofluorocarbon etching compound including —$NH_x$ containing ions, where x=0-2, which deposit on the patterned photoresist layer and the sidewall of the aperture while etching;
introducing an oxidizer into the reaction chamber;
not introducing an oxidizer into the reaction chamber;
the oxidizer being selected from the group consisting of is selected from the group consisting of $O_2$, $O_3$, CO, $CO_2$, NO, $NO_2$, $N_2O$, $SO_2$, COS, $H_2O$ and combination thereof;
the oxidizer being $O_2$;
mixing the hydrofluorocarbon etching gas and the oxidizer prior to introduction into the reaction chamber;
introducing the hydrofluorocarbon etching gas into the reaction chamber separately from the oxidizer;
introducing the oxidizer continuously into the reaction chamber and introducing the hydrofluorocarbon etching gas into the reaction chamber in pulses;
the oxidizer comprising approximately 0.01% v/v to approximately 99.9% v/v of a total volume of the hydrofluorocarbon etching gas and oxidizer introduced into the reaction chamber;
the oxidizer comprising approximately 0.01% v/v to approximately 10% v/v of a total volume of the hydrofluorocarbon etching gas and oxidizer introduced into the reaction chamber;
introducing an inert gas into the reaction chamber;
not introducing an inert gas into the reaction chamber;
the inert gas being selected from the group consisting of He, Ar, Xe, Kr, and Ne;
the inert gas being Ar;
mixing the hydrofluorocarbon etching gas and the inert gas prior to introduction to the reaction chamber to produce a mixture;
introducing the hydrofluorocarbon etching gas into the reaction chamber separately from the inert gas;
introducing the inert gas continuously into the reaction chamber and introducing the hydrofluorocarbon etching gas into the reaction chamber in pulses;
the inert gas comprising approximately 0.01% v/v to approximately 99.9% v/v of a total volume of the hydrofluorocarbon etching gas and inert gas introduced into the reaction chamber;

the inert gas comprising approximately 90% v/v to approximately 99% v/v of a total volume of the hydrofluorocarbon etching gas and inert gas introduced into the reaction chamber;

improving selectivity by introducing an additional etch gas into the reaction chamber;

the additional etch gas being selected from the group consisting of $cC_4F_8$, $C_4F_8$, $C_4F_6$, $CF_4$, $CH_3F$, $CHF_3$, $CH_2F_2$, COS, $CF_3I$, $C_2F_3I$, $C_2F_5I$, F—C≡N, $CS_2$, $SO_2$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), or cis-1,1,2,2,3,4-hexafluorocyclobutane (cis-$C_4H_2F_6$);

the additional etch gas being $CHF_3$;

the additional etch gas being $cC_5F_8$;

the additional etch gas being $cC_4F_8$;

the additional etch gas being $C_4F_6$;

mixing the hydrofluorocarbon etching gas and the additional etch gas prior to introduction to the reaction chamber;

introducing the hydrofluorocarbon etching gas into the reaction chamber separately from the additional etch gas;

introducing approximately 0.01% v/v to approximately 99.99% v/v of the additional etch gas into the reaction chamber;

activating the plasma by applying RF power;

activating the plasma by a RF power ranging from approximately 25 W to approximately 20,000 W;

the reaction chamber having a pressure ranging from approximately 1 mTorr to approximately 10 Torr;

introducing the hydrofluorocarbon etching gas into the reaction chamber at a flow rate ranging from approximately 0.1 sccm to approximately 1 slm;

maintaining the substrate at a temperature ranging from approximately −196° C. to approximately 500° C.;

maintaining the substrate at a temperature ranging from approximately −120° C. to approximately 300° C.;

maintaining the substrate at a temperature ranging from approximately −100° C. to approximately 50° C.;

maintaining the substrate at a temperature ranging from approximately −10° C. to approximately 40° C.; and measuring the plasma activated hydrofluorocarbon etching compound by Quadrupole mass spectrometer, optical emission spectrometer, FTIR, or other radical/ion measurement tool.

Also disclosed are nitrogen-containing hydrofluorocarbon etching compounds having a —$NH_2$ functional group. The disclosed nitrogen-containing hydrofluorocarbon etching compounds include one or more of the following aspects:

the hydrofluorocarbon etching compound being a nitrogen-containing organofluorine compound;

the hydrofluorocarbon etching compound containing a terminal —$NH_2$ functional group;

the hydrofluorocarbon etching compound containing a non-terminal —$NH_2$ functional group;

the hydrofluorocarbon etching compound containing one nitrogen atom the hydrofluorocarbon etching compound being 2,2,2-Trifluoroethanamine ($C_2H_4F_3N$);

the hydrofluorocarbon etching compound being 1,1,2-Trifluoroethan-1-amine (Iso-$C_2H_4F_3N$);

the hydrofluorocarbon etching compound being 2,2,3,3,3-Pentafluoropropylamine ($C_3H_4F_5N$);

the hydrofluorocarbon etching compound being 1,1,1,3,3-Pentafluoro-2-Propanamine (Iso-$C_3H_4F_5N$);

the hydrofluorocarbon etching compound being 1,1,1,3,3-Pentafluoro-(2R)-2-Propanamine (Iso-2R—$C_3H_4F_5N$);

the hydrofluorocarbon etching compound being 1,1,1,3,3-Pentafluoro-(2S)-2-Propanamine (Iso-2S—$C_3H_4F_5N$);

the hydrofluorocarbon etching compound being 1,1,1,3,3,3-Hexafluoroisopropylamine ($C_3H_3F_6N$);

the hydrofluorocarbon etching compound being 1,1,2,3,3,3-Hexafluoro-1-Propanamine (Iso-$C_3H_3F_6N$);

having a purity ranging from approximately 95% to approximately 99.999% by volume;

comprising between approximately 10 parts per trillion to approximately 5% by volume trace gas impurities;

the trace gas impurities comprising water;

the trace gas impurities comprising $CO_2$;

the trace gas impurities comprising $N_2$; and the nitrogen-containing hydrocarbon etching compounds having a water content of less than 20 ppmw.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, the term "etch" or "etching" refers to a plasma etch process (i.e., a dry etch process) in which ion bombardment accelerates the chemical reaction in the vertical direction so that vertical sidewalls are formed along the edges of the masked features at right angles to the substrate (Manos and Flamm, Plasma Etching an Introduction, Academic Press, Inc. 1989 pp. 12-13). The etching process produces apertures, such as apertures, trenches, channel holes, gate trenches, staircase contacts, capacitor holes, contact holes, staircase etches, slit etches, buried contact etches, capacitor contact etches, shallow trench isolation etches etc., in the substrate.

The term "pattern etch" or "patterned etch" refers to etching a non-planar structure, such as a patterned hardmask layer on a stack of silicon-containing films.

The term "pattern wafer" or "wafer" refers to a wafer having a stack of silicon-containing films on a substrate and a patterned hardmask layer on a stack of silicon-containing films formed for pattern etch.

The term "mask" refers to a layer that resists etching. The hardmask layer may be located above the layer to be etched.

The term "etch stop" refers to a layer that resists etching located below the layer to be etched that protects layers underneath.

The term "device channel" refers to layers that are part of actual device and any damage to it will affect device performance.

The term "aspect ratio" refers to a ratio of the height of a trench (or aperture) to the width of the trench (or the diameter of the aperture).

The term "selectivity" means the ratio of the etch rate of one material to the etch rate of another material. The term "selective etch" or "selectively etch" means to etch one material more than another material, or in other words to have a greater or less than 1:1 etch selectivity between two materials.

The term "independently" when used in the context of describing R groups should be understood to denote that the subject R group is not only independently selected relative to other R groups bearing the same or different subscripts or superscripts, but is also independently selected relative to any additional species of that same R group. For example, in the formula $MR^1_x(NR^2R^3)_{(4-x)}$, where M is an atom, x is 2 or 3, the two or three $R^1$ groups may, but need not be identical to each other or to $R^2$ or to $R^3$. Further, it should be understood that unless specifically stated otherwise, values of R groups are independent of each other when used in different formulas.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "etching compound" and "etching gas" may be used interchangeably when the etching compound is in a gaseous state under room temperature and room pressure. It is understood that an etching compound may correspond to, or related to an etching gas, and that the etching gas may refer to the etching compound.

The terms "via", "aperture" and "hole" are sometimes used interchangeably, and generally mean an opening in an interlayer insulator which provides a physical pathway for direct electrical connection.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as SiN and SiO, are listed throughout the specification and claims without reference to their proper stoichoimetry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1A:
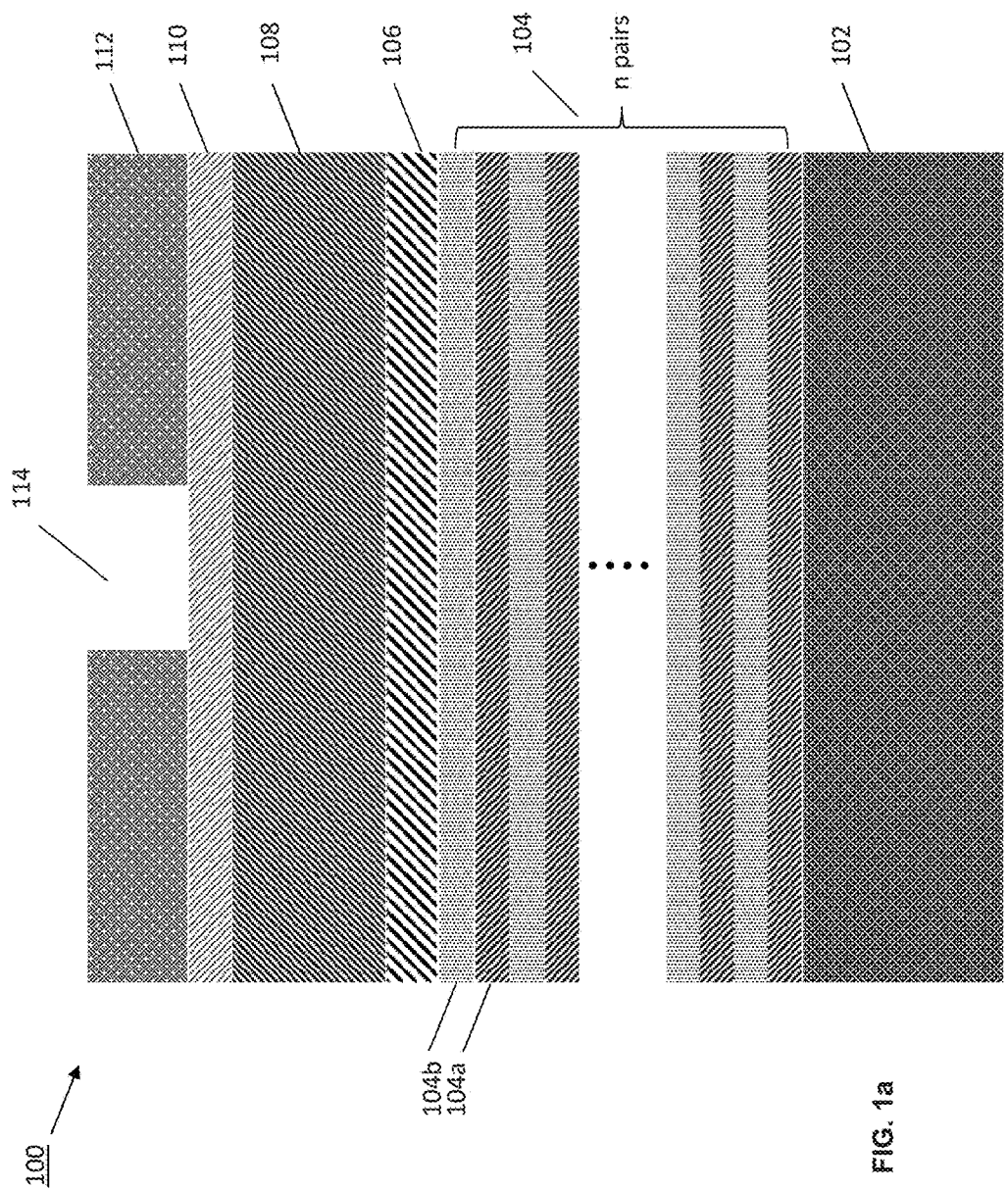
FIG. 1a is an exemplary cross-sectional side view of exemplary layers in a 3D NAND stack to produce a 3D NAND gate in the art.

Disclosed are methods for plasma etching silicon-containing films in 3D NAND and DRAM applications. More specifically, the disclosed are methods for fabricating a semiconductor structure for forming channel holes, staircase contacts, staircase etches, slit etches, contact holes, gate trenches, capacitor holes, buried contact etches, capacitor contact etches, shallow trench isolation etches, etc. therein. The disclosed are methods for etching a DARC cap layer, such as a SiON layer, on top of a stack of layers of various materials to be patterned in the subsequent processing steps. The disclosed are methods for etching the stack of layers of various materials, such as, alternating layers of silicon-containing layers. The disclosed are methods for etching the layers of silicon-containing layers, such as, SiO/SiN (ONON) or SiO/p-Si (OPOP) layer, following the preceding processing steps of etching the DARC layer.

The disclosed method for etching a structure of silicon-containing layers disposed over a substrate. The structure includes a DARC layer deposited over alternating layers of a first silicon-containing layer and a second silicon-containing layer, a patterned photoresist layer formed over the DARC layer, and a hardmask layer formed in between the DARC layer and the alternating layers. The method comprising the steps of selectively plasma etching the DARC layer versus the patterned photoresist layer using a hydrofluorocarbon etching compound to produce apertures in the DARC layer, selectively plasma etching the hardmask layer exposed by the apertures in the DARC layer versus the patterned photoresist layer and the DARC layer with an etching gas suitable for etching the hardmask layer to extend the apertures through the hardmask layer, and selectively plasma etching the alternating layers not covered by the hardmask layer versus the hardmask layer using the hydrofluorocarbon etching compound above to extend the apertures in the alternating layers, wherein the first silicon-containing layer and the second silicon-containing layer are etched non-selectively. That is, the etching of the first silicon-containing layer to a second silicon-containing layer has selectivity about 1:1.

The disclosed hydrofluorocarbon etching compound may be 2,2,2-Trifluoroethanamine ($C_2H_4F_3N$). The disclosed hydrofluorocarbon etching compound may be 1,1,2-Trifluoroethan-1-amine (Iso-$C_2H_4F_3N$). The disclosed hydrofluorocarbon etching compound may be 1,1,1,3,3,3-Hexafluoroisopropylamine ($C_3H_3F_6N$). The disclosed hydrofluorocarbon etching compound may be 1,1,2,3,3,3-hexafluoro-1-Propanamine (Iso-$C_3H_3F_6N$). The disclosed hydrofluorocarbon etching compound may be 2,2,3,3,3-Pentafluoropropylamine ($C_3H_4F_5N$). The disclosed hydrofluorocarbon etching compound may be 1,1,1,3,3-pentafluoro-2-Propanamine (Iso-$C_3H_4F_5N$). The disclosed hydrofluorocarbon etching compound may be 1,1,1,3,3-pentafluoro-(2R)-2-Propanamine (Iso-2R—$C_3H_4F_5N$). The disclosed hydrofluorocarbon etching compound may be 1,1,1,3,3-pentafluoro-(2S)-2-Propanamine (Iso-2S—$C_3H_4F_5N$).

The disclosed hydrofluorocarbon etching compounds have a —$NH_2$ functional group. The disclosed hydrofluorocarbon etching compounds are a nitrogen-containing organofluorine compound and contain one nitrogen.

The disclosed hydrofluorocarbon etching compounds are commercially available and their structure formula, CAS numbers and boiling points are included in Table 1. One of ordinary skill in the art will recognize that the synthesis methods for these compounds may be obtained using the CAS numbers provided.

TABLE 1

Commercially available etching compounds

| Etching Compounds | Formula | Structure | CAS Number | Boiling Point (° C.) |
|---|---|---|---|---|
| 2,2,2-Trifluoroethanamine | $C_2H_4F_3N$ | | 753-90-2 | 36-37 |
| 1,1,2-Trifluoroethan-1-amine | Iso-$C_2H_4F_3N$ | | 918824-70-1 | ~73* |
| 2,2,3,3,3-Pentafluoropropyl-amine | $C_3H_4F_5N$ | | 422-03-7 | 49 |

TABLE 1-continued

Commercially available etching compounds

| Etching Compounds | Formula | Structure | CAS Number | Boiling Point (° C.) |
|---|---|---|---|---|
| 1,1,1,3,3-Pentafluoro-2-Propanamine | Iso-$C_3H_4F_5N$ | (structure) | 1780535-11-6 | ~94* |
| 1,1,1,3,3-Pentafluoro-(2R)-2-Propanamine | Iso-2R-$C_3H_4F_5N$ | (structure) | 1932026-24-8 | ~94* |
| 1,1,1,3,3-Pentafluoro-(2S)-2-Propanamine | Iso-2S-$C_3H_4F_5N$ | (structure) | 1932502-84-5 | ~94* |
| 1,1,1,3,3,3-Hexafluoroisopropyl-amine | $C_3H_3F_6N$ | (structure) | 1619-92-7 | 57-58 |
| 1,1,2,3,3,3-Hexafluoro-1-Propanamine | Iso-$C_3H_3F_6N$ | (structure) | 107377-08-2 | ~30* |

*indicates Scifinder predicted boiling points.

Herein, the disclosed hydrofluorocarbon etching compounds 2,2,2-Trifluoroethanamine ($C_2H_4F_3N$), 1,1,2-Trifluoroethan-1-amine (Iso-$C_2H_4F_3N$), 1,1,1,3,3,3-Hexafluoroisopropylamine, 1,1,2,3,3,3-hexafluoro-1-Propanamine, 2,2,3,3,3-Pentafluoropropylamine ($C_3H_4F_5N$), 1,1,1,3,3-pentafluoro-2-Propanamine (Iso-$C_3H_4F_5N$), 1,1,1,3,3-pentafluoro-(2R)-2-Propanamine (Iso-2R—$C_3H_4F_5N$) and 1,1,1,3,3-pentafluoro-(2S)-2-Propanamine (Iso-2S—$C_3H_4F_5N$) may etch the silicon-containing films including a SiON layer and the alternating layers of SiO layer and SiN layer (i.e., ONON) or the alternating layers of SiO layer and p-Si layer (i.e., OPOP). The disclosed hydrofluorocarbon etching compounds 1,1,1,3,3,3-Hexafluoroisopropylamine ($C_3H_3F_6N$) and 1,1,2,3,3,3-hexafluoro-1-Propanamine (Iso-$C_3H_3F_6N$) may etch the silicon-containing films including the SiON layer and the alternating layers of SiO layer and SiN layer (i.e., ONON).

The hydrofluorocarbon etching compounds above include one —$NH_2$ group. The —$NH_2$ group may be at the terminal carbon. The —$NH_2$ group may be not at the terminal carbon. As shown in the examples that follow, Applicants believe that this —$NH_2$ group helps produce superior etching profile because N containing species in the plasma activated etching compounds help deposit a protective polymer layer on the etching structure.

The disclosed hydrofluorocarbon etching compounds may provide high selectivity to photoresist layers, hardmask layers and etch stop layers and device channel materials, no selectivity to silicon-containing layers, such as SiO, SiN and p-Si, and no profile distortion in high aspect ratio structures, such as those having an aspect ratio ranging from 1:1 to 200:1 in DRAM and 3D NAND applications.

The disclosed hydrofluorocarbon etching compounds may provide infinite selectivity for wide process conditions of etching. Herein the selectivity refers to the etching rate ratio of two different layers. For example, the selectivity for SiON layer vs. patterned photoresist layer is the etch rate of the SiON divided by the etching rate of the patterned photoresist layer. The disclosed hydrofluorocarbon etching compounds may provide improved selectivity between the silicon-containing films and the patterned photoresist layer and less damage to photoresist materials. The disclosed hydrofluorocarbon etching compounds are provided at greater than 95% v/v purity, preferably at greater than 99.99% v/v purity, and more preferably at greater than 99.999% v/v purity. The disclosed hydrofluorocarbon etching compounds contain less than 5% by volume trace gas impurities, with less than 150 ppm by volume of impurity gases, such as $N_2$ and/or $H_2O$ and/or $CO_2$, contained in said trace gaseous impurities. Preferably, the water content in the plasma etching gas is less than 20 ppmw by weight. The purified product may be produced by distillation and/or passing the gas or liquid through a suitable adsorbent, such as a 4 Å molecular sieve.

Applicants believe that the molecules having 2-3 carbon atoms may provide better sidewall protection during the etching process than the $C_1$ molecules. For sidewall protection, the $C_3$ molecules are preferred because Applicants believe they will produce thicker passivation layers. Exemplary $C_3$ $NH_2$-containing etching compounds include $C_3H_4F_5N$ and $C_3H_3F_6N$ and their isomers. However, the $C_2$ molecules may be easier to deliver to the reactor or, for some applications, thinner passivation layers may be preferred. Exemplary $C_2$ $NH_2$-containing etching compounds include $C_2H_4F_3N$ and its isomer.

The disclosed hydrofluorocarbon etching compounds contain less than 10% v/v, preferably less than 1% v/v, more preferably less than 0.1% v/v, and even more preferably less than 0.01% v/v of any of its isomers, which may be purified by distillation of the gas or liquid to remove isomers and may provide better process repeatability.

Alternatively, the disclosed hydrofluorocarbon etching compounds may contain between 5% v/v and 50% v/v of its isomers, particularly when the isomer mixture provides improved process parameters or if isolation of the target isomer is too difficult or expensive. For example, the disclosed hydrofluorocarbon etching compounds may comprise between approximately 50% v/v and approximately 75% v/v 2,2,3,3,3-Pentafluoropropylamine ($C_3H_4F_5N$) and between approximately 25% v/v and approximately 50% v/v 2,2,3,3-tetrafluoropropionitrile. The mixture of isomers may reduce the need for two or more gas lines to the reaction chamber.

The disclosed hydrofluorocarbon etching compounds are gaseous at room temperature and room pressure. The disclosed hydrofluorocarbon etching compounds are suitable for plasma etching silicon-containing films, such as, SiON, SiO, SiN, p-Si films. The disclosed hydrofluorocarbon etching compounds are not only compatible with currently available photoresist and hardmask materials but also compatible with the future generations of photoresist and hardmask materials because the disclosed hydrofluorocarbon etching compounds induce little to no damage on the photoresist and on the hardmask along with good profile of high aspect ratio structures. In order to achieve these properties, the disclosed hydrofluorocarbon etching compounds may deposit an etch-resistant polymer layer on the sidewall of the etched structure during etching to help reduce the direct impact or bombardment of the oxygen and fluorine radicals to the etch profile during the etching process. Preferably, the disclosed hydrofluorocarbon etching compounds are suitably volatile and stable during the etching process for delivery into the reactor/chamber.

Material compatibility tests are important to determine if any of the disclosed hydrofluorocarbon etching compounds will react with chamber materials and degrade the performance of the chamber with short term or long term use. Key materials involved in parts of the chamber, valves, etc. include stainless steel, aluminum, nickel, PCTFE, PVDF, PTFE and other metals and polymers. At times these materials are exposed to high temperatures, for example, higher than 20° C., and high pressures, for example, higher than 1 atm, which may enhance their degradation. The metrology methods may include visual inspection, weight measurement, measuring nanometer scale changes in SEM, tensile strength, hardness, etc.

The disclosed hydrofluorocarbon etching compounds may be used to plasma etch silicon-containing films, such as SiON film, capped on top of a semiconductor structure, such as, a 3D NAND flash memory, having alternating layers of SiO/SiN or SiO/p-Si, or a DRAM memory. The disclosed hydrofluorocarbon etching compounds may also be used to plasma etch silicon-containing films on a substrate, such as, the alternating layers of SiO/SiN or SiO/p-Si, or a DRAM memory, such as silicon oxide layer. The disclosed plasma etching method may be useful in the manufacture of semiconductor devices such as NAND or 3D NAND gates or Flash or DRAM memory or transistors such as fin-shaped field-effect transistor (FinFET), Lateral Gate-All-Around (LGAA) devices and Vertical Gate-All-Around (VGAA) devices, Bulk complementary metal-oxide-semiconductor (Bulk CMOS), fully depleted silicon-on-insulator (FD-SOI) structures, Monolithich 3D (M3D). The disclosed hydrofluorocarbon etching compounds may be used in other areas of applications, such as different front end of the line (FEOL) and back end of the line (BEOL) etch applications and low k applications as well. Additionally, the disclosed hydrofluorocarbon etching compounds may also be used for etching Si in 3D through silicon aperture (TSV) etch applications for interconnecting memory to logic on a substrate.

The plasma etching method includes providing a reaction chamber having a substrate disposed therein. The reaction chamber may be any enclosure or chamber within a device in which etching methods take place such as, and without limitation, reactive ion etching (RIE), capacitively coupled plasma (CCP) with single or multiple frequency RF sources, inductively coupled plasma (ICP), Electron Cyclotron Resonance (ECR) or microwave plasma reactors, or other types of etching systems capable of selectively removing a portion of the silicon-containing film or generating active species. One of ordinary skill in the art will recognize that the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher dielectric etch product family sold under the trademark 2300® Flex™. The RF power in such may be pulsed to control plasma properties and thereby improving the etch performance (selectivity and damage) further.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant $O_2$ may be decomposed into two O' radicals. Preferably, the remote plasma may be generated with a power ranging from about 1 kW to about 10 kW, more preferably from about 2.5 kW to about 7.5 kW.

The reaction chamber may contain one or more than one substrate. For example, the reaction chamber may contain from 1 to 200 silicon wafers having from 25.4 mm to 450 mm diameters. The substrates may be any suitable substrates used in semiconductor, photovoltaic, flat panel or LCD-TFT device manufacturing. Examples of suitable substrates include wafers, such as silicon, silica, glass, sapphire, germanium or a III-V compound, such as GaAs wafers. The wafer will have multiple films or layers on it from previous manufacturing steps, including silicon-containing films or layers. The layers may or may not be patterned. Examples of suitable layers include without limitation silicon (such as amorphous silicon, p-Si, crystalline silicon, any of which may further be p-doped or n-doped with B, C, P, As, and/or Ge), silica, silicon nitride, silicon oxide, silicon oxynitride, $Si_aO_bH_cC_dN_e$, (where a>0; b, c, d, e≥0), mask layer materials such as amorphous carbon, doped amorphous carbon such as amorphous carbon doped with boron, nitrogen, sulfur, chlorine, fluorine or metals (Al, Zr, Ti, W), antireflective coatings, photoresist materials, tungsten, titanium nitride, tantalum nitride or combinations thereof, etch stop layer materials such as silicon nitride, polysilicon, crystalline silicon, silicon carbide (SiC), silicon carbon nitride (SiCN) or combinations thereof, device channel materials such crystalline silicon, epitaxial silicon, doped silicon, $Si_aO_bH_cC_dN_e$, (where a>0; b, c, d, e≥0) or combinations thereof. The silicon oxide layer may form a dielectric material, such as an organic based or silicon oxide based low-k dielectric material (e.g., a porous SiCOH film). An exemplary low-k dielectric material is sold by Applied Materials under the trade name Black Diamond II or III. Additionally, layers comprising tungsten or noble metals (e.g. platinum, palladium, rhodium or gold) may be used. Furthermore, examples of the silicon-containing films may be $Si_aO_bH_cC_dN_e$, (where a>0; b, c, d, e≥0). Throughout the specification and claims, the wafer and any associated layers thereon are referred to as substrates.

Also disclosed are methods of using the disclosed hydrofluorocarbon etching compounds for fabricating a semiconductor structure under plasma etching conditions. The disclosed methods provide for the use of the N-containing hydrofluorocarbon etching compounds for plasma etching the Si-containing films. The disclosed methods also provide for inhibiting damage to a patterned photoresist mask layer or a pattern hardmask layer, protecting a patterned photoresist mask layer or a pattern hardmask layer, or reinforcing a patterned photoresist mask layer or a pattern hardmask layer while forming apertures, holes or trenches in a substrate. The disclosed methods are useful in the manufacture of semiconductor, such as in 3D NAND and DRAM applications.

The disclosed methods include: forming a semiconductor structure having a DARC layer over alternating layers of a first silicon-containing layer and a second silicon-containing layer, a patterned photoresist layer over the DARC layer, and a hardmask layer in between the DARC layer and the alternating layers, introducing the disclosed hydrofluorocarbon etching gas into the reactor, plasma activating the disclosed hydrofluorocarbon etching gas, selectively etching the DARC layer versus the patterned photoresist layer using the activated disclosed hydrofluorocarbon etching gas to produce apertures in the DARC layer, selectively plasma etching the hardmask layer exposed by the apertures in the DARC layer with an etching gas suitable for etching the hardmask layer to extend the apertures through the hardmask layer, selectively plasma etching the alternating layers not covered by the hardmask layer versus the hardmask layer using the disclosed hydrofluorocarbon etching gas above to extend the apertures in the alternating layers, wherein the first silicon-containing layer and the second silicon-containing layer are etched non-selectively. The disclosed methods also include the step of simultaneously depositing a polymer layer on the sidewall of the apertures while etching the DARC layer, the hardmask layer and the alternating layers.

The disclosed methods for reinforcing a patterned photoresist layer or a pattern hardmask on a semiconductor structure while forming apertures therein include: forming the semiconductor structure having a DARC layer over an etch target layer and a patterned photoresist layer over the DARC layer and selectively plasma etching the DARC layer versus the patterned photoresist layer using a hydrofluorocarbon etching compound selected from the group consisting of 2,2,2-Trifluoroethanamine ($C_2H_4F_3N$), 1,1,2-Trifluoroethan-1-amine (Iso-$C_2H_4F_3N$), 2,2,3,3,3-Pentafluoropropylamine ($C_3H_4F_5N$), 1,1,1,3,3-Pentafluoro-2-Propanamine (Iso-$C_3H_4F_5N$), 1,1,1,3,3-Pentafluoro-(2R)-2-Propanamine (Iso-2R—$C_3H_4F_5N$) and 1,1,1,3,3-Pentafluoro-(2S)-2-Propanamine (Iso-2S—$C_3H_4F_5N$), 1,1,1,3,3,3-Hexafluoroisopropylamine ($C_3H_3F_6N$) and 1,1,2,3,3,3-Hexafluoro-1-Propanamine (Iso-$C_3H_3F_6N$) to produce the apertures in the DARC layer, while simultaneously depositing a polymer layer on the patterned photoresist layer and the sidewall of the apertures.

The disclosed methods for fabricating a semiconductor structure having alternating layers of silicon-containing layers include: forming the semiconductor structure having a patterned hardmask layer over the alternating layers of silicon-containing layers on a substrate and selectively plasma etching the alternating layers of silicon-containing layers versus the patterned hard mask layer using a hydrofluorocarbon etching compound selected from the group consisting of 2,2,2-Trifluoroethanamine ($C_2H_4F_3N$), 1,1,2-Trifluoroethan-1-amine (Iso-$C_2H_4F_3N$), 2,2,3,3,3-Pentafluoropropylamine ($C_3H_4F_5N$), 1,1,1,3,3-Pentafluoro-2-Propanamine (Iso-$C_3H_4F_5N$), 1,1,1,3,3-Pentafluoro-(2R)-2-Propanamine (Iso-2R—$C_3H_4F_5N$) and 1,1,1,3,3-Pentafluoro-(2S)-2-Propanamine (Iso-2S—$C_3H_4F_5N$), 1,1,1,3,3,3-Hexafluoroisopropylamine ($C_3H_3F_6N$) and 1,1,2,3,3,3-Hexafluoro-1-Propanamine (Iso-$C_3H_3F_6N$) to produce apertures in the alternating layers of silicon-containing layers, while simultaneously depositing a polymer layer on the hard mask layer and the sidewall of the apertures, wherein the first silicon-containing layer and the second silicon-containing layer are etched non-selectively. Herein the first silicon-containing layer comprises a silicon oxide layer and the second silicon-containing layer comprises a silicon nitride layer, and vice versa; and the first silicon-containing layer comprises a silicon oxide layer and the second silicon-containing layer comprises a polysilicon layer, and vice versa.

The disclosed methods for fabricating a semiconductor structure having alternating layers of silicon-containing layers include: forming the semiconductor structure having a patterned hardmask layer over the alternating layers of silicon-containing layers on a substrate and selectively plasma etching the alternating layers of silicon-containing layers versus the patterned hard mask layer using 1,1,1,3,3,3-Hexafluoroisopropylamine ($C_3H_3F_6N$) to produce apertures in the alternating layers of silicon-containing layers, while simultaneously depositing a polymer layer on the hard mask layer and the sidewall of the apertures, wherein the first silicon-containing layer and the second silicon-containing layer are etched non-selectively. Herein the first silicon-containing layer comprises a silicon oxide layer and the second silicon-containing layer comprises a silicon nitride layer, and vice versa.

The following are exemplary embodiments of the semiconductor patterned substrates on which the disclosed hydrofluorocarbon etching gases may be applied to etch.

In one embodiment, a substrate 100 may include a stack of multiple layers as shown in FIG. 1a. As shown, a stack of n pairs of alternating layers of SiO/SiN or ONON (i.e., 104a/104b) 104 is deposited on top of a silicon wafer 102 (i.e., ONON such as TCAT technology or P-BiCS technology). Here n is integer. Preferably, n=96. More preferably, n=128 or 256, or even more. One of ordinary skill in the art will recognize that the number of the alternating layers of SiO/SiN 104 in the stack of the substrate 100 may vary. A hardmask layer 106 is deposited on top of the alternating layers of SiO/SiN 104. An inorganic dielectric cap layer 108 is deposited on top of the hardmask layer 106 and serves as a DARC layer. An organic BARC layer 110 is applied on top of the inorganic dielectric cap layer 108 to further reduce reflection of light during patterning of a photosensitive layer. The organic BARC layer 110 typically comprises polyamides and polysulfones over which a patterned photoresist layer 112 (i.e., the photosensitive layer) is to be coated. The patterned photoresist layer 112 includes a plurality of patterned holes (one hole 114 is shown herein) formed by a photolithography operation, which define a plurality of recess regions (e.g., contact holes, channel holes, trenches, etc.) in the 3D NAND stack or DRAM applications.

Here, one of ordinary skill in the art will recognize the silicon wafer 102 may be replaced with germanium wafer or Si—Ge wafer or with tungsten (W) wafer, and in some applications the SiN layers 104b may be replaced with p-Si layers (e.g., SiO/p-Si or OPOP), thereby a stack of n pairs of alternating layers of SiO/p-Si or OPOP will be formed on top of silicon wafer 102, where n is integer.

The alternating layers of SiO/SiN (or SiO/p-Si) 104 may include a layer of silicon oxide, silicon nitride, polysilicon, crystalline silicon, SiOCN, SiON, $Si_aO_bH_cC_dN_e$, where a>0; b, c, d and e≥0, or combinations thereof. The alternating layers of SiO/SiN (or SiO/p-Si) 104 may include materials containing Mg, Ca, Sr, Ba, Nb, Ta, Al, Si, Ge, group 4 transition metals such as Ti, Zr or Hf, lanthanide metals such as La, Y, Sc, Ce, Pr, Nd, Sm, Eu, Gd, Tb, Dy, Ho, Er, Tm, Yb and Lu, or combination thereof. Alternatively, the SiO, SiN or p-Si layers may include materials containing Mg, Ca, Sr, Ba, Nb, Ta, Al, Si, Ge, 4 transition metals such as Ti, Zr or Hf, lanthanide metals such as La, Y, Sc, Ce, Pr, Nd, Sm, Eu, Gd, Tb, Dy, Ho, Er, Tm, Yb and Lu, or combination thereof.

The hardmask layer 106 may contain C and H, as well as other elements, such as boron, nitrogen, oxygen, sulfur, chlorine, fluorine, aluminum, tungsten, titanium, zirconium etc., to improve etch resistance during SiO/SiN layer etch. One example of a boron-doped carbonaceous material is available from Applied Materials, Inc. of Santa Clara, Calif. under the trade name of advanced patterning film (APF), more particularly a species of the APF genus of materials known as APFc, which is boron doped. The hardmask layer 106 may be a thermal CVD, PECVD or spray on/spin on deposited layer of a-C or doped a-C, such as amorphous carbon doped with boron, nitrogen, sulfur, chlorine, fluorine or metals (Al, Zr, Ti, W). The hardmask layer 106 may be silicon-containing spin on mask, carbon-containing spin on mask, photoresist, etc.

The inorganic dielectric cap layer 108 may be a single film or a multi-layered stack of films comprising at least silicon and typically further including nitride, oxygen to form a silicon oxynitride (SiON) layer. SiON typically, but is not limited to, has a formula of $SiO_xN_yH_zC_k$, wherein x ranges from 0 to 2, y ranges from 0 to 1, z ranges from 0 to about 1 and k ranges from 0 to 1. By changing the composition of the SiON DARC layer, one can control reflection onto the photoresist during imaging of the photoresist layer. When $SiO_xN_yH_zC_k$ is used as an ARC, x, y, and z typically range between about 0.2 and about 0.5. SiON is commonly used as an antireflective coating in combination with deep ultraviolet (DUV) photoresists during photolithography because of its ability to absorb light. Conventional ARC layers, such as spin-on organic polymers, have been used to suppress unwanted reflections by utilizing the absorption properties of the film. However, due to the self-planarization nature of spin-on films, an organic ARC film has thickness variation over topology and therefore results in different absorptivity through the film. The thickness variation in the polymer ARC would cause etching problems since there is a minimum etch selectivity between organic photoresist and organic ARC film. Therefore, dielectric ARC, which works by using phase-shift cancellation, has been introduced. When the reflections from the substrate and from the ARC surface are 180° out of phase with each other, the reflection will cancel each other by destructive interface. A phase shift of half wavelength for the wave passing through the DARC can be achieved by optimizing the thickness and the refractive index of the DARC. The composition, optical properties and thickness of the inorganic dielectric cap layer 108 may also be tuned to provide minimal reflections and high contrast for a particular wavelength employed during photolithographic patterning of features. The inorganic dielectric cap layer 108 may be deposited by CVD or PECVD method. With the number of pairs (i.e., n) of the alternating layers of SiO/SiN 104 getting larger, the thickness of the inorganic dielectric cap layer 108 (e.g., SiON layer) may be getting thicker. In exemplary embodiments, the inorganic dielectric cap layer 108 is formed to a thickness of between about 5 nm and 1000 nm, more particularly between 10 nm and 800 nm, and even more particularly between 10 nm and 500 nm. In some embodiments, it may only have the inorganic dielectric cap layer 108 over the hardmask layer 106. In alternative embodiments, it may be necessary to have both an organic BARC 110 and the inorganic dielectric cap layer 108 over the hardmask layer 106.

The inorganic dielectric cap layer 108 serves as a DARC layer and/or improves adhesion of subsequent organic films, for example, the organic BARC layer 110, applied by spin on techniques, which may otherwise not adhere well to the hardmask layer 106, for example, a boron-doped a-C hardmask layer. The inorganic dielectric cap layer 108 also plays a role to transfer pattern in the photoresist layer 112 to the hardmask layer 106 by etching with the disclosed hydrofluorocarbon etching compounds to form a mask pattern in the inorganic dielectric cap layer 108 over the hardmask layer 106. The recess regions may be formed by further i) etching the hardmask layer 106 selectively versus the inorganic dielectric cap layer 108 with an etching gas suitable for etching the hardmask, such as, the etching gas selected from $cC_4F_8$, $C_4F_8$, $C_4F_6$, $C_5F_8$, $CF_4$, $CH_3F$, $CF_3H$, $CH_2F_2$, COS, $CS_2$, $CF_3I$, $C_2F_3I$, $C_2F_5I$, CFN, FNO, $SO_2$ and combination thereof, and ii) etching the silicon containing films (e.g., alternating layers of SiO/SiN or ONON 104) selectively versus the mask pattern formed in the hardmask layer 106 with either the disclosed hydrofluorocarbon etching compounds or other etching gases suitable for etching the silicon containing films under plasma etching conditions.

The patterned photoresist layer 110 may include both positive- and negative-acting materials. Suitable positive-acting materials include positive-acting chemically amplified photoresists, which undergo a photoacid-promoted deprotection reaction of acid labile groups of one or more components of the composition to render exposed regions of a coating layer of the resist more soluble in an aqueous developer than unexposed regions. Typical photoacid-labile groups of the photoresist resins include ester groups that contain a tertiary non-cyclic alkyl carbon (e.g., t-butyl) or a tertiary alicyclic carbon (e.g., methyladamantyl) covalently linked to the carboxyl oxygen of the ester. Acetal photoacid-labile groups are also used.

Suitable negative-acting resists typically will contain a crosslinking component. The crosslinking component is typically present as a separate resist component Amine-based crosslinkers such as a melamine, for example, the Cymel melamine resins, are typical. Negative-acting photoresist compositions useful in the embodiments include a mixture of materials that will cure, crosslink or harden upon exposure to acid, and a photoactive component of the disclosed embodiments. Particularly useful negative acting compositions comprise a resin binder such as a phenolic resin, a crosslinker component and a photoactive component. Typical phenolic resins for use as the resin binder component include novolaks and poly(vinylphenol)s. Typical crosslinkers include amine-based materials, including melamine, glycolurils, benzoguanamine-based materials and urea-based materials. Melamine-formaldehyde resins are generally most typical. Such crosslinkers are commercially available, for example: the melamine resins sold by Cytec Industries under the trade names Cymel 300, 301 and 303.

One of ordinary skill in the art will recognize that the stack of layers in the substrate 100 is provided for exemplary purposes only and that the disclosed hydrofluorocarbon etching gases may be used to etch other types of stacks of layers, for example, for a stack where the a-C mask layer 106 is replaced with a TiN layer.

Figure 1B:
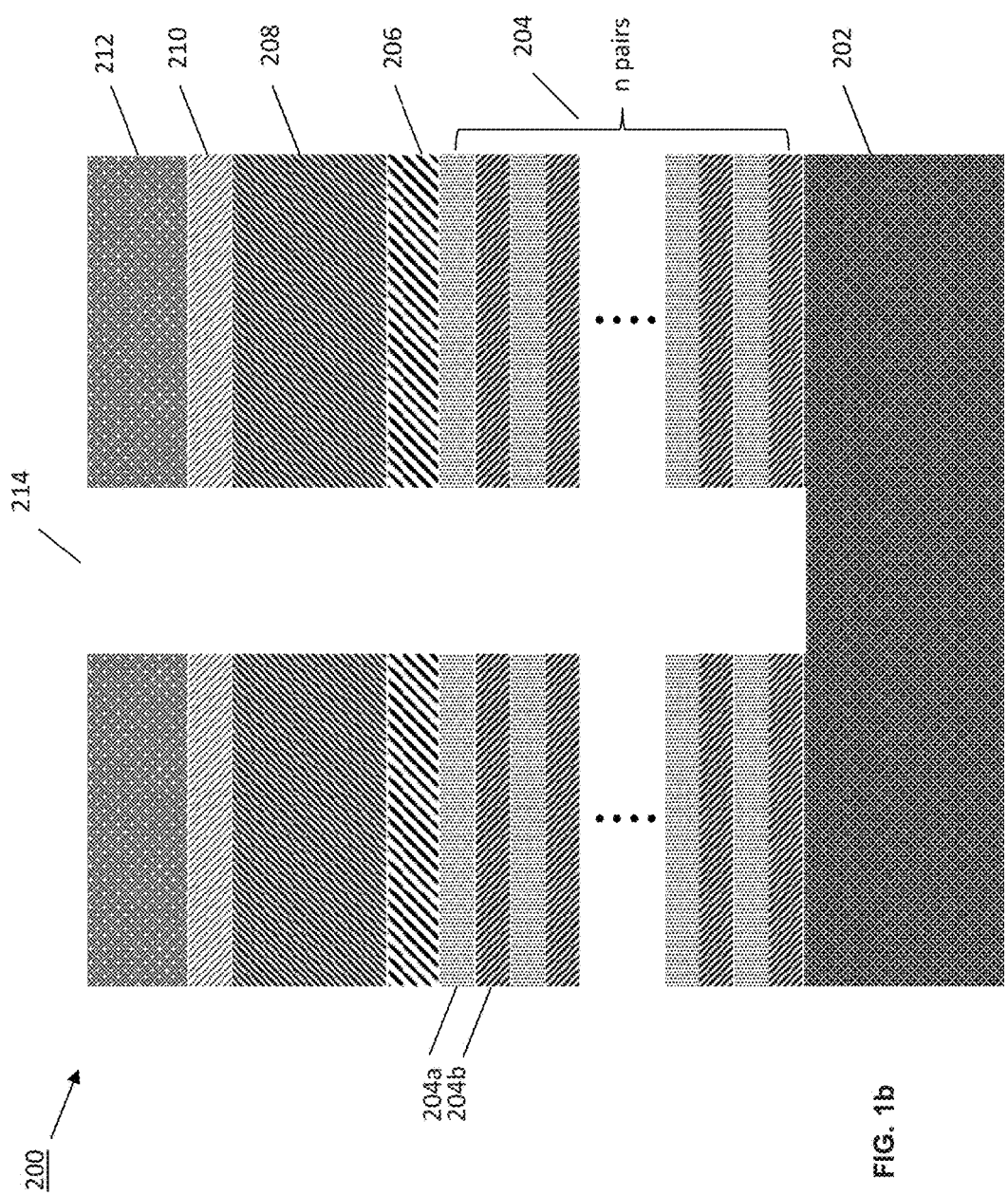
FIG. 1b is a cross-sectional side view of the exemplary layers in the 3D NAND stack showing a high aspect ratio hole formed therein by plasma etching using the disclosed hydrofluorocarbon etching compounds.

FIG. 1b is a cross-sectional side view of the exemplary layers in the 3D NAND stack showing a high aspect ratio hole formed therein by plasma etching using the disclosed hydrofluorocarbon etching compounds. Aperture 214 is formed by i) etching the inorganic dielectric cap layer 208 selectively versus the patterned photoresist layer 212 with the disclosed hydrofluorocarbon etching compounds under plasma etching conditions; ii) etching the hardmask layer 206 selectively versus the patterned photoresist layer 212 and the inorganic dielectric cap layer 208 with an etching gas suitable for etching the hardmask layer under plasma etching conditions; and iii) etching the alternating layers of silicon-containing layers 204 selectively versus the patterned photoresist layer 212, the inorganic dielectric cap layer 208 and the hardmask layer 206 with either the disclosed hydrofluorocarbon etching compounds or other etching gases suitable for etching the alternating layers of silicon-containing layers 204 under plasma etching conditions. Applicants believe aperture 214 may have an aspect ratio ranging from 1:1 to 50:1 in channel hole and contact hole etch applications, preferably an aspect ratio ranging from approximately 1:1 to approximately 200:1.

The etching gases suitable for etching the hardmask layer 206 may include fluorocarbon etching gas ($C_xF_y$, x is integers, y=2x+2 or y=2x or y=2x−2), such as $CF_4$, $C_4F_6$, $C_4F_8$, $C_5F_8$, hydrofluorocarbon etching gas ($C_xH_yF_z$, x and y are integers, z=2x-y+2 or z=2x-y or z=2x-y−2), such as $CHF_3$, $CH_2F_2$, $CH_3F$, oxidizers, such as $O_2$, COS, fluorine compounds, such as $CF_3I$, $Cl_2$, HBr, $SF_6$, $NF_3$, inert gas, such as $N_2$, or combinations thereof.

The other etching gases suitable for etching the alternating layers of silicon containing films may be fluorocarbons ($C_xF_y$, x is integers, y=2x+2 or y=2x or y=2x−2) or hydrofluorocarbons ($C_xH_yF_z$, x and y are integers, z=2x-y+2 or z=2x-y or z=2x-y−2), such as $cC_4F_8$, $C_4F_8$, $C_4F_6$, $CF_4$, $CH_3F$, $CHF_3$, $CH_2F_2$, or other fluorine compounds or S-containing and O-containing compounds, such as COS, $CF_3I$, $C_2F_3I$, $C_2F_5I$, FCN, $CS_2$, $SO_2$.

Figure 1C:
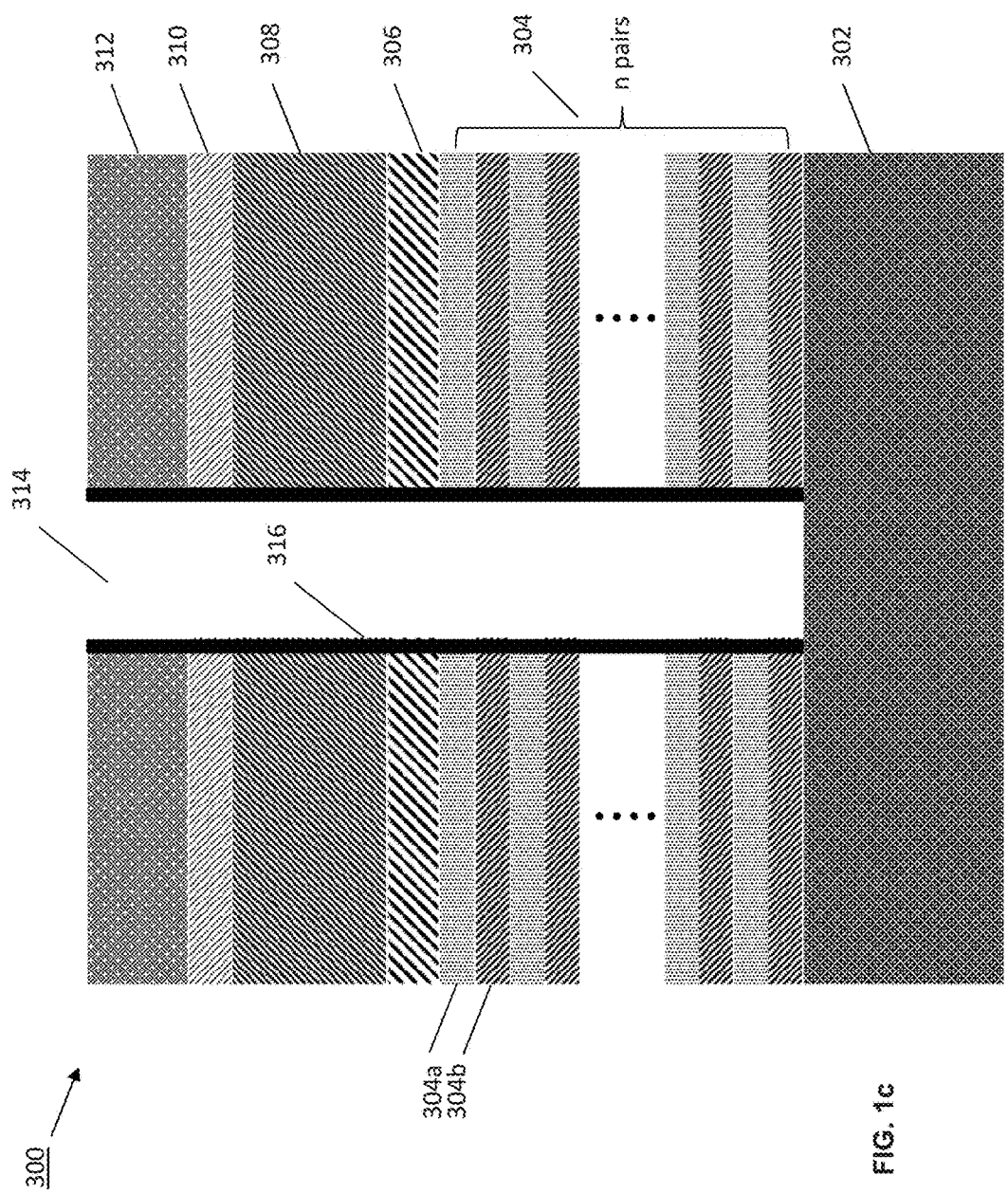
FIG. 1c is an exemplary cross-sectional side view of the exemplary layers in the 3D NAND stack showing polymer deposited on a sidewall during etching in the 3D NAND stack.

FIG. 1c is a cross-sectional side view of the exemplary layers in the 3D NAND stack showing polymer deposited on a sidewall of the aperture during etching. The disclosed hydrofluorocarbon etching gases produce ions, neutrals, radicals or fragments during the plasma process that are suitable for both anisotropically etching the silicon containing films, such as SiON, SiO, SiN, p-Si and depositing a polymer passivation layer 316 on sidewalls of the structure being etched, herein the aperture as shown in FIG. 1c. The disclosed hydrofluorocarbon etching gases may produce hydrofluorocarbon ions and nitrogen-containing hydrocarbon ions during the plasma process. The hydrofluorocarbon ions react with SiON to anisotropically etch the inorganic dielectric cap layer 308 forming the apertures 314. The nitrogen-containing hydrocarbon ions deposit on the sidewall of the apertures 314 forming the polymer passivation layer 316, thereby protecting the sidewall of the apertures 314 from the bombardment of the hydrofluorocarbon ions. The polymer passivation layer 316 prevents the sidewall of the aperture 314 from etching away by the hydrofluorocarbon ions. The polymer passivation layer 316 is an etching-resistant polymer layer that prevents the sidewall of the apertures 314 from etching away through the bombardment of the hydrofluorocarbon ions. The polymer passivation layer 316 results in a pattern etch structure having a vertical profile that is straight with no bowing or tapering. Bowing may result from sidewall etching of the mask layer, which may often be an amorphous carbon (a-C) material. The a-C materials may be etched by oxygen radicals in the plasma which may cause increased opening of the mask and result in bow-like, or angled/curved, etch structures. It is important to minimize bowing and to achieve high aspect ratio (i.e., up to 200:1) needed for current applications (e.g., contact etch or 3D NAND). By adding $O_2$ to the disclosed hydrofluorocarbon etch compounds, the thickness of the polymer passivation layer is under control thereby avoiding the sidewall profile deformation due to the polymer deposition. The polymer passivation layer 316 also provides smoother sidewall, less bowing and less deformation at the bottom of the aperture 314. The polymer passivation layer 316 may however be easily removed or cleaned or polished by dry or wet etch chemistries well known in the art.

Replacing the alternating SiO/SiN layer in FIG. 1a to FIG. 1c with a $SiO_2$ layer, the exemplary layers become DRAM stacks used to produce DRAM memory. Etching processes for the DRAM stacks are similar to those for 3D NAND stacks depicted in FIG. 1a to FIG. 1c. That is, apertures in a DRAM stack are obtained by i) plasma etching an inorganic dielectric cap layer selectively versus a patterned photoresist layer with the disclosed hydrofluorocarbon etching compounds; ii) plasma etching a hardmask layer selectively versus the patterned photoresist layer and the inorganic dielectric cap layer with an etching gas suitable for etching the hardmask, the suitable etching gas may include fluorocarbon etching gas ($C_xF_y$, x is integers, y=2x+2 or y=2x or y=2x−2), such as $CF_4$, $C_4F_6$, $C_4F_8$, $C_5F_8$, hydrofluorocarbon etching gas ($C_xH_yF_z$, x and y are integers, z=2x-y+2 or z=2x-y or z=2x-y−2), such as $CHF_3$, $CH_2F_2$, $CH_3F$, oxidizers, such as $O_2$, COS, fluorine compounds, such as $CF_3I$, $Cl_2$, HBr, $SF_6$, $NF_3$, inert gas, such as $N_2$, or combinations thereof; and iii) plasma etching the silicon dioxide layer selectively versus the patterned photoresist layer, the inorganic dielectric cap layer and the hardmask layer with either the disclosed hydrofluorocarbon etching compounds or other etching gases suitable for etching the silicon containing films. The other etching gases suitable for etching the alternating layers of silicon containing films may be fluorocarbons ($C_xF_y$, x is integers, y=2x+2 or y=2x or y=2x−2) or hydrofluorocarbons ($C_xH_yF_z$, x and y are integers, z=2x-y+2 or z=2x-y or z=2x-y−2), such as $cC_4F_8$, $C_4F_8$, $C_4F_6$, $CF_4$, $CH_3F$, $CHF_3$, $CH_2F_2$, or other fluorine compounds or S-containing and O-containing compounds, such as COS, $CF_3I$, $C_2F_3I$, $C_2F_5I$, FCN, $CS_2$, $SO_2$. The aperture may have an aspect ratio ranging from 1:1 to 50:1 in channel hole and contact hole etch applications, preferably an aspect ratio ranging from approximately 1:1 to approximately 200:1.

The disclosed hydrofluorocarbon etching compounds also deposit a polymer passivation layer on the sidewalls of the aperture. By adding $O_2$ to the disclosed hydrofluorocarbon etch compounds, the thickness of the polymer passivation layer is under control thereby avoiding the sidewall profile deformation. The polymer passivation layer also provides smoother sidewall, less to no bowing and less to no deformation at the bottom of the aperture in the DRAM stacks. The polymer passivation layer may be easily removed or cleaned or polished by dry or wet etch chemistries well known in the art.

One of ordinary skill in the art will recognize that the stack and geometry of layers in FIG. 1a to FIG. 1c are provided for exemplary purposes only and that the disclosed hydrofluorocarbon etching gases may be used to etch other types of stacks of layers. Furthermore, one of ordinary skill in the art will recognize that the number of layers in the stack may vary (i.e., may include more or less than the layers depicted).

In one embodiment, the disclosed hydrofluorocarbon etching gas is introduced into the reaction chamber containing the substrate and silicon-containing films. The gas may be introduced to the chamber at a flow rate ranging from approximately 0.1 sccm to approximately 1 slm. For example, for a 200 mm wafer size, the gas may be introduced to the chamber at a flow rate ranging from approximately 5 sccm to approximately 50 sccm. Alternatively, for a 450 mm wafer size, the gas may be introduced to the chamber at a flow rate ranging from approximately 25 sccm to approximately 250 sccm. One of ordinary skill in the art will recognize that the flow rate may vary from tool to tool.

The disclosed hydrofluorocarbon etching compounds may be supplied either in neat form or in a blend with an inert gas, such as $N_2$, Ar, Kr, He, Xe, Ne, etc., or solvent. The disclosed hydrofluorocarbon etching compounds may be present in varying concentrations in the blend.

Additionally, the hydrofluorocarbon etching compounds are delivered in purity ranging from 95% to 99.999% by volume or could be purified with known standard purification techniques for removal of CO, $CO_2$, $N_2$, $H_2O$, HF, $H_2S$, $SO_2$, halides, and other hydrocarbons or hydrohalocarbons.

An inert gas is also introduced into the reaction chamber in order to sustain the plasma. The inert gas may be He, Ar, Xe, Kr, Ne, $N_2$ or combinations thereof. The etching gas and the inert gas may be mixed prior to introduction to the chamber, with the inert gas comprising between approximately 0.01% v/v and approximately 99.9% v/v of the resulting mixture. Alternatively, the inert gas may be introduced to the chamber continuously while the etching gas is introduced to the chamber in pulses.

The disclosed hydrofluorocarbon etching gas and the inert gas are activated by plasma to produce an activated etching gas. The plasma decomposes the etching compound into radical form (i.e., the activated etching gas). The plasma may be generated by applying RF or DC power. The plasma may be generated with a RF power ranging from about 25 W to about 20,000 W. The plasma may be generated remotely or within the reactor itself. The plasma may be generated in dual CCP or ICP mode with RF applied at both electrodes. RF frequency of plasma may range from 200 KHz to 1 GHz. Different RF sources at different frequency may be coupled and applied at same electrode. Plasma RF pulsing may be further used to control molecule fragmentation and reaction at substrate. One of skill in the art will recognize methods and apparatus suitable for such plasma treatment.

Quadrupole mass spectrometer (QMS), optical emission spectrometer, FTIR, or other radical/ion measurement tools may measure the activated etching gas from the chamber exhaust to determine the types and numbers of species produced. If necessary, the flow rate of the etching gas and/or the inert gas may be adjusted to increase or decrease the number of radical species produced.

The disclosed hydrofluorocarbon etching gas may be mixed with other gases either prior to introduction into the reaction chamber or inside the reaction chamber. Preferably, the gases may be mixed prior to introduction to the chamber in order to provide a uniform concentration of the entering gas.

In another alternative, the disclosed hydrofluorocarbon etching gas may be introduced into the chamber independently of the other gases such as when two or more of the gases react.

In another alternative, the disclosed hydrofluorocarbon etching gas and the oxygen containing gas are the only two gases that are used during the etching process.

In another alternative, the disclosed hydrofluorocarbon etching gas, the oxygen containing gas and the inert gas are the only three gases that are used during the etching process.

Exemplary other gases include, without limitation, oxidizers such as $O_2$, $O_3$, CO, $CO_2$, NO, $NO_2$, $N_2O$, $SO_2$, COS, $H_2O$ and combination thereof, inert gases such as He, Ar, Xe, Kr, Ne and $N_2$, preferably Ar. The disclosed etching gases, the oxidizer and/or the inert gas may be mixed together prior to introduction into the reaction chamber.

Alternatively, the oxidizer may be introduced continuously into the chamber and the etching gas introduced into the chamber in pulses. The oxidizer may comprise between approximately 0.01% v/v to approximately 99.99% v/v of the mixture introduced into the chamber (with 99.99% v/v representing introduction of almost pure oxidizer for the continuous introduction alternative).

Other exemplary gases with which the etching gas may be mixed include additional etching gases, such as $cC_4F_8$, $C_4F_8$, $C_4F_6$, $CF_4$, $CH_3F$, $CF_3H$, $CH_2F_2$, COS, $CS_2$, $CF_3I$, $C_2F_3I$, $C_2F_5I$, $SO_2$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), or cis-1,1,2,2,3,4-hexafluorocyclobutane (cis-$C_4H_2F_6$) and combination thereof, preferably, $CHF_3$, $cC_5F_8$, $cC_4F_8$ or $C_4F_6$.

The disclosed hydrofluorocarbon etching gas and the additional etching gas may be mixed prior to introduction to the reaction chamber. The additional etching gas may comprise between approximately 0.01% v/v to approximately 99.99% v/v of the mixture introduced into the chamber.

The silicon-containing films, such as SiON, SiO, SiN, or p-Si film, and the activated etching gas react to form volatile by-products that are removed from the reaction chamber. The a-C mask and photoresist layer are less reactive with the activated etching gas. Thus, the activated etching gas selectively reacts with the silicon-containing films to form volatile by-products.

The temperature and the pressure within the reaction chamber are held at conditions suitable for the silicon-containing film to react with the activated etching gas. For instance, the pressure in the chamber may be held between approximately 0.1 mTorr and approximately 1000 Torr, preferably between approximately 1 mTorr and approximately 10 Torr, more preferably between approximately 10 mTorr and approximately 1 Torr, and more preferably between approximately 10 mTorr and approximately 100 mTorr, as required by the etching parameters. Likewise, the substrate temperature in the chamber may range between about approximately −196° C. to approximately 500° C., preferably between approximately −120° C. to approximately 300° C., more preferably between approximately −100° C. to approximately 50° C.; and more preferably between approximately −10° C. to approximately 40° C. Chamber wall temperatures may range from approximately −196° C. to approximately 300° C. depending on the process requirements.

The reactions between the silicon-containing film and the activated etching gas result in anisotropic removal of the silicon-containing films from the substrate. Atoms of nitrogen, oxygen, and/or carbon may also be present in the silicon-containing film. The removal is due to a physical sputtering of silicon-containing film from plasma ions (accelerated by the plasma) and/or by chemical reaction of plasma species to convert Si to volatile species, such as $SiF_x$, wherein x ranges from 1-4.

The plasma activated disclosed hydrofluorocarbon etching gas preferably exhibits high selectivity toward the photoresist and etches through the DARC cap layer on top of SiO layer or alternating layers of SiO/SiN or SiO/p-Si and exhibits high selectivity toward the hardmask layer and etches through the SiO layer or alternating layers of SiO/SiN or SiO/p-Si on a substrate as well, resulting in a vertical etch profile without roughness, which are important for 3D NAND and DRAM applications. Additionally, the plasma activated disclosed hydrofluorocarbon etching gas deposits a polymer layer on sidewall of the vertical etch profile to inhibit feature profile deformation.

The disclosed etch processes use the disclosed hydrofluorocarbon etching compounds as the etching gases to etch the silicon-containing layers, such SiON, SiO, SiN and p-Si layers, to form patterns in the DARC cap layer in 3D NAND or DRAM structure for producing channel holes, gate trenches, staircase contacts, capacitor holes, contact holes, staircase etches, slit etches, buried contact etches, capacitor contact etches, shallow trench isolation etches etc., in the silicon-containing films in the subsequent processing steps. The disclosed hydrofluorocarbon etching compounds are also used as the etching gases to etch the silicon-containing films forming apertures in the silicon-containing films after forming the patterns in the DARC cap layer. The sidewall of the resulting patterns and/or the apertures may have an aspect ratio ranging from approximately 1:1 to approximately 200:1 and a diameter ranging from approximately 5 nm to approximately 100 nm. Typical materials that need to be etched by the disclosed hydrofluorocarbon etching compounds may be silicon-containing compositions, such as, SiON in the DARC cap layer, ONON or OPOP in the 3D NAND stack, and SiO in the DRAM stacks.

EXAMPLES

The following non-limiting examples are provided to further illustrate embodiments of the invention. However, the examples are not intended to be all inclusive and are not intended to limit the scope of the inventions described herein.

In the following examples, the etch performance of hydrofluorocarbon etching compounds, 2,2,2-Trifluoroethanamine ($C_2H_4F_3N$), 1,1,2-Trifluoroethan-1-amine (Iso-$C_2H_4F_3N$), 2,2,3,3,3-Pentafluoropropylamine ($C_3H_4F_5N$), 1,1,1,3,3-Pentafluoro-2-Propanamine (Iso-$C_3H_4F_5N$), 1,1,1,3,3-Pentafluoro-(2R)-2-Propanamine (Iso-2R—$C_3H_4F_5N$) and 1,1,1,3,3-Pentafluoro-(2S)-2-Propanamine (Iso-2S—$C_3H_4F_5N$), 1,1,1,3,3,3-Hexafluoroisopropylamine ($C_3H_3F_6N$) and 1,1,2,3,3,3-Hexafluoro-1-Propanamine (Iso-$C_3H_3F_6N$), are evaluated and compared against $CHF_3$ (CAS 75-46-7) and a mixture of traditional etching gas $CF_4$+ $CHF_3$, mixed with $NH_3$. The results show that $C_2H_4F_3N$, $C_3H_3F_6N$ and $C_3H_4F_5N$ offer high SiON/PR selectivity with minimum PR deformation. In addition, $C_3H_3F_6N$ offers non-selective etching of ONON layers and infinite selectivity of amorphous carbon hard mask. $C_3H_4F_5N$ offers non-selective etching of ONON or OPOP layers and high selectivity of amorphous carbon hard mask. Both $C_3H_3F_6N$ and $C_3H_4F_5N$ offer less to no bowing and less to no profile deformation and may be used for fabricating a semiconductor structure.

Figure 2:
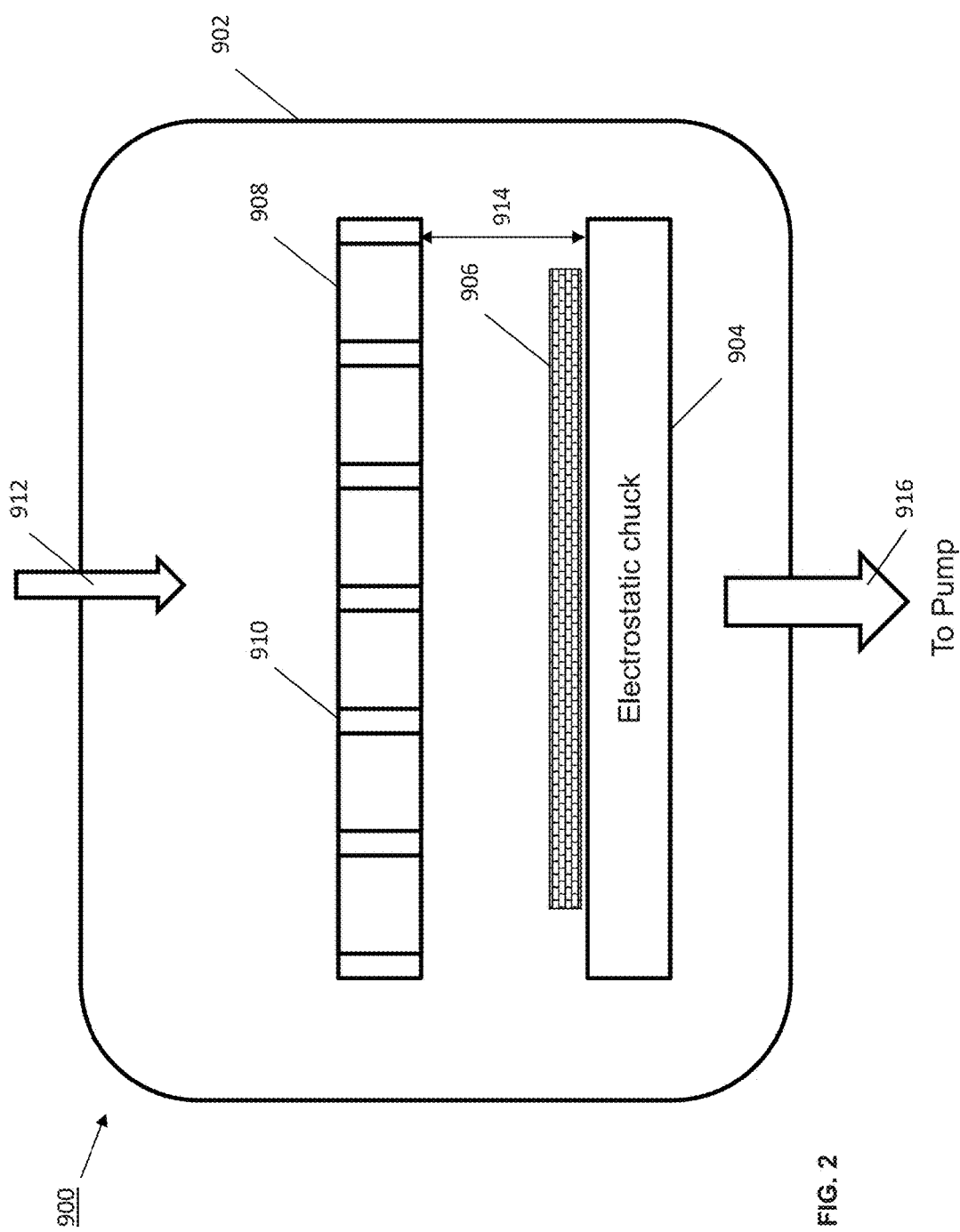
FIG. 2 is a cross-sectional side view of exemplary reactor system applied in deposition and etching tests.

FIG. 2 is an exemplary cross-sectional side view of exemplary reactor system applied in deposition and etching tests. As shown, reactor 900 includes a reactor chamber 902. Inside of the reactor chamber 902, a wafer 906 attached on top of a bottom electrode 904 is placed in the bottom portion of the reactor chamber 902, and a silicon top electrode showerhead 908 is placed on top portion of the reactor chamber 902. The bottom electrode 904 may be an electrostatic chuck having bias power applied thereto. For example, 2 MHz RF bias power is applied to the bottom electrode 904. The wafer 906 may have multi layers that need to be etched. The silicon top electrode showerhead 908 has a plurality of holes 910 in the showerhead through which the gases pass. The gases may be introduced into the reactor chamber 902 through gas inlet 912 and then pass through holes 910 in the showerhead 908 for uniform gas distribution. Source power may be applied to the silicon top electrode showerhead 908. For example, 27 MHz RF source power may be applied to the silicon top electrode showerhead 908. Between the silicon top electrode showerhead 908 and the bottom electrode 904 is the plasma region. Numeral 914 shows gap distance (double arrows) of the silicon top electrode showerhead 908 and the bottom electrode 904. For example, a gap distance of 1.35cm may be selected for etching tests. The gases passing through the holes 910 in the showerhead 908 are ionized in the plasma region and then perform etching on the wafer 906. The gases are removed by pumping the gases out of the reactor chamber 902 from outlet 916.

Figure 3:
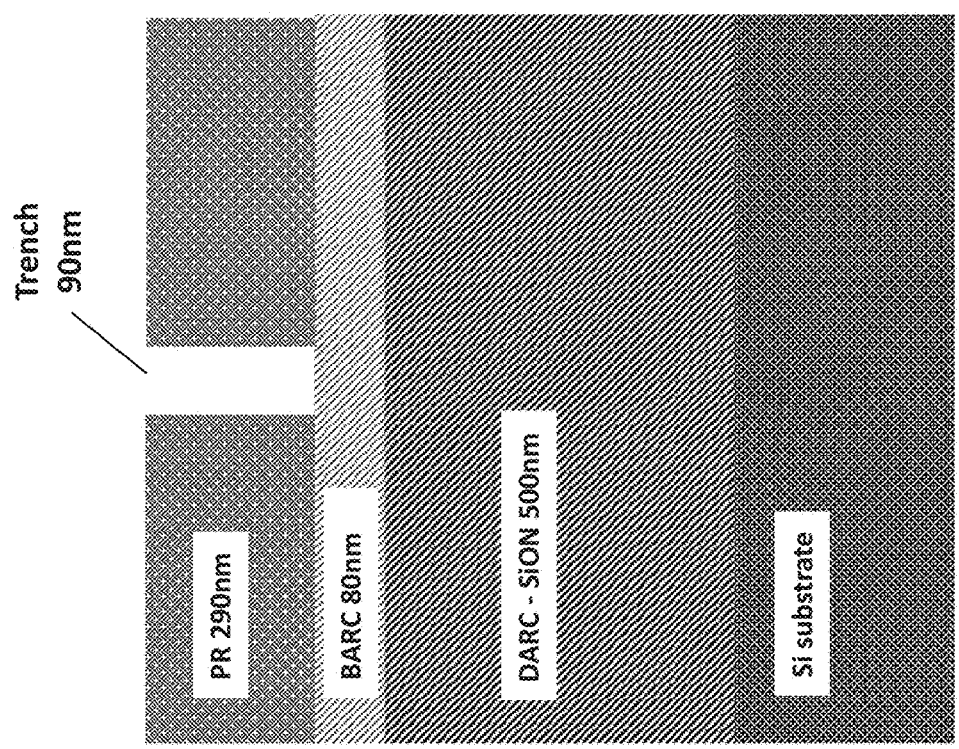
FIG. 3 is an exemplary cross-sectional side view of exemplary wafer pattern used in the disclosed embodiments.

Etching tests were carried out with commercial LAM tool (dual frequency plasma with 10 gas lines). The planar wafers and the patterned wafers were purchased from Advantive Tech and processed with LAM tool. The planar wafers are 300 nm of SiON on Si substrate, 300 nm of PR on Si substrate, 2 μm of $SiO_2$ on Si substrate, 2 μm of SiN on Si substrate, 300 μm of p-Si on Si substrate, 350 nm of a-C on Si substrate respectively. The pattern wafers, as shown in FIG. 3, feature a structure of a SiON layer deposited on a Si substrate over which is an 80 nm BARC layer and a 290 nm PR layer. The SiON layer is 500 nm. The trench openings are around 90 nm.

Etching tests were performed at 30 mTorr, source power in the range of 300 W to 750 W (27 MHz), and bias power in the range of 600 W to 1500 W (2 MHz). The feed mixture contains 250 sccm of Ar, 15 sccm of etch gas, while $O_2$ is varied in the range 0 to 25 sccm. The flow rates of the tested etching gases maintain constant (e.g., 15 sccm) while Ar flow rate varies from 150 to 300 sccm. One of ordinary skilled in the art will recognize during etching processes, $O_2$ flow rate, etch time, source power, bias power, and pressure vary.

Deposition tests were performed on 1.5×1.5 cm² 300 nm of PR and SiON coupons on Si substrate at 30 mTorr, source power of 750 W (27 MHz), with no bias power at the substrate. The process feed the mixture contains 250 sccm of Ar, 15 sccm of etch gas and no $O_2$. Because of the absence of the bias power, the ions reaching the substrate may not have sufficient energy to etch. In addition, the neutrals and the active species reaching the surface stick to the surface, based on their sticking coefficient, and deposit a thin polymer layer. This thin polymer layer may be responsible for sidewall passivation and often provides the selectivity. The deposition test experimental condition helps simulate the polymer layer formed during plasma processing of patterns either on surface or on sidewalls. Depending on the tested etching compounds, a deposition time ranging between 15 and 30 s was selected.

Additionally, a mass spectrometer may be used to study electron impact ionizations of the etch gases. For this test, the etch gases are allowed to flow through the mass spectrometer chamber and a Quadrupole mass spectrometer (Hiden Analytical Inc.) detector is used to study the fragments from the etch gas as a function of electron energy.

Comparative Example 1

Figure 4:
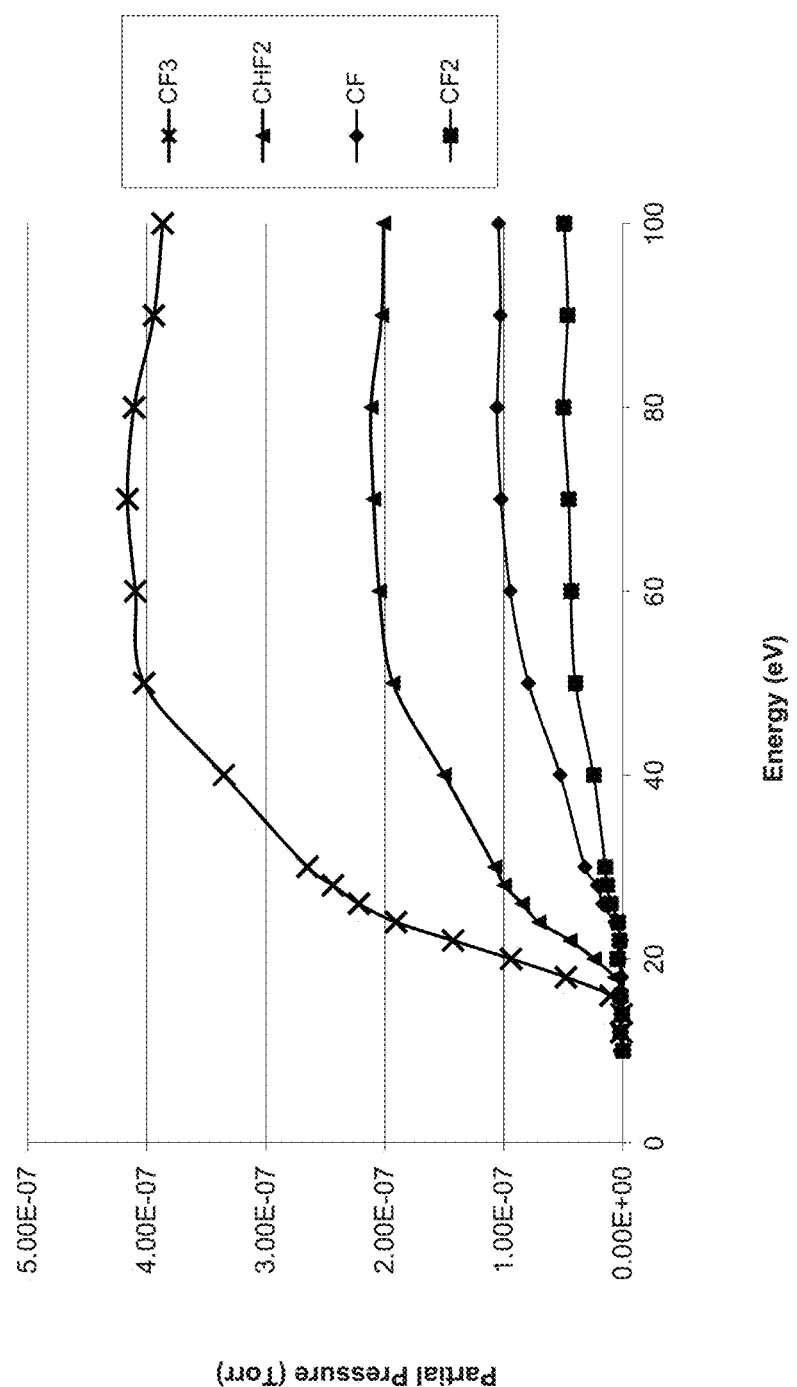
FIG. 4 is a graph demonstrating the electron impact ionization energy versus pressure of the species produced by $CHF_3$.

FIG. 4 is a graph demonstrating the electron impact ionization energy versus pressure of the species produced by $CHF_3$. The x-axis represents electron energy and y-axis represents the partial pressure of the fragment species. The primary species, $CF_3$ and $CHF_2$ for $CHF_3$ have a high F/C ratio and thus a limited polymer deposition may occur by $CHF_3$. Polymer deposition rate increases as the ratio of F/C of the activated plasma species decreases (See, e.g., U.S. Pat. No. 6,387,287 to Hung et al.).

The planar wafer etching tests were performed at 30 mTorr, source power of 300 W (27 MHz), bias power of 600 W (2 MHz) and electrode gap of 1.35 cm. The feed mixture contains 250 sccm of Ar, 15 sccm of etch gas, while $O_2$ is varied from 0 to 20sccm. The etching time is 30 seconds.

Figure 5:
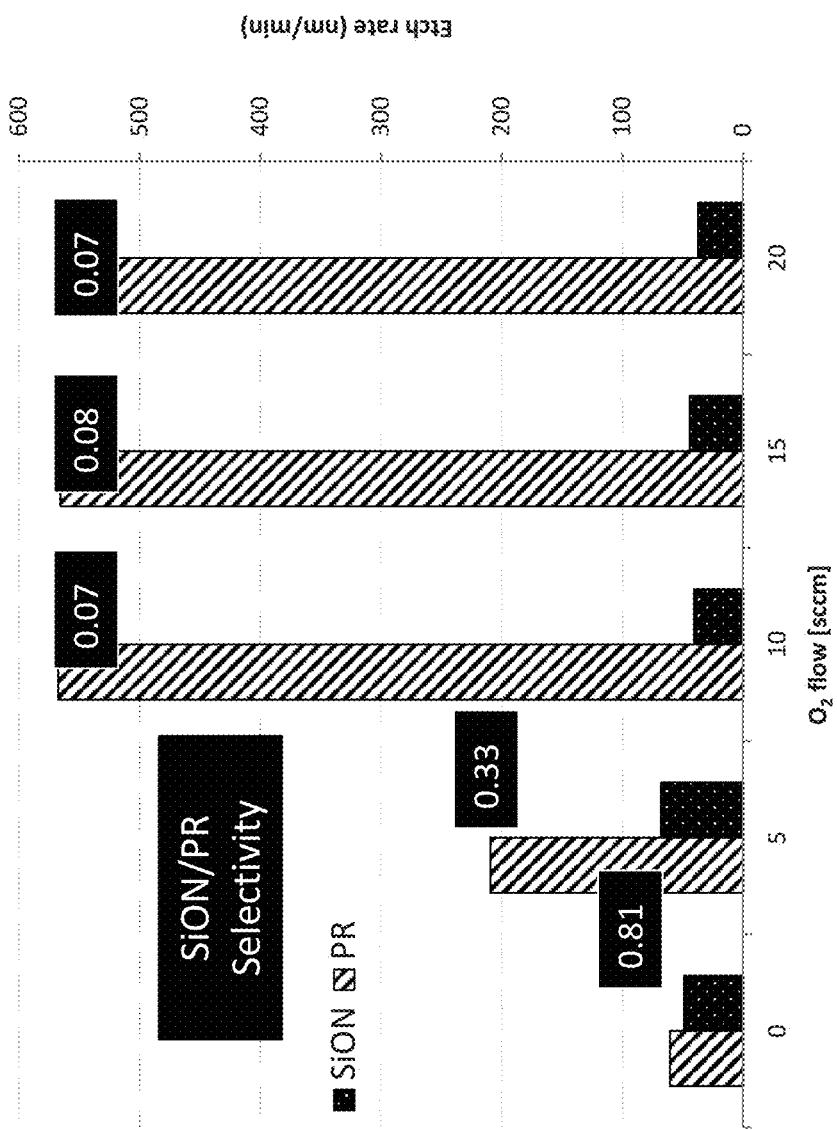
FIG. 5 is a graph demonstrating etch rates of SiON and PR films as a function of oxygen flow rate using $CHF_3$, Ar and $O_2$.

FIG. 5 is a graph demonstrating etch rates of SiON and PR films as a function of oxygen flow rate using $CHF_3$, Ar and $O_2$. The etching conditions are as flows: the flow rate of $CHF_3$: 15 sccm; the flow rate of Ar: 250 sccm; the pressure: 30 mTorr; the etching time: 30 s; $RF_{source/bias}$: 300/600 W; the temperature: 20° C. As shown, there is no SiON/PR selectivity higher than 1. Without $O_2$ addition, the selectivity of SiON/PR is close to 1 but smaller than 1 (0.81). With $O_2$ flow rate increasing to 20 sccm, PR etch rate is increased showing the PR layer is damaged and the SiON/PR selectivity decreases dramatically. Since no polymer deposition is formed on the PR layer, $O_2$ addition results in more O species in the plasma to etch away the PR. When $O_2$ flow rate reaches to 10-20 sccm, the PR may be completely etched away.

Figure 6:
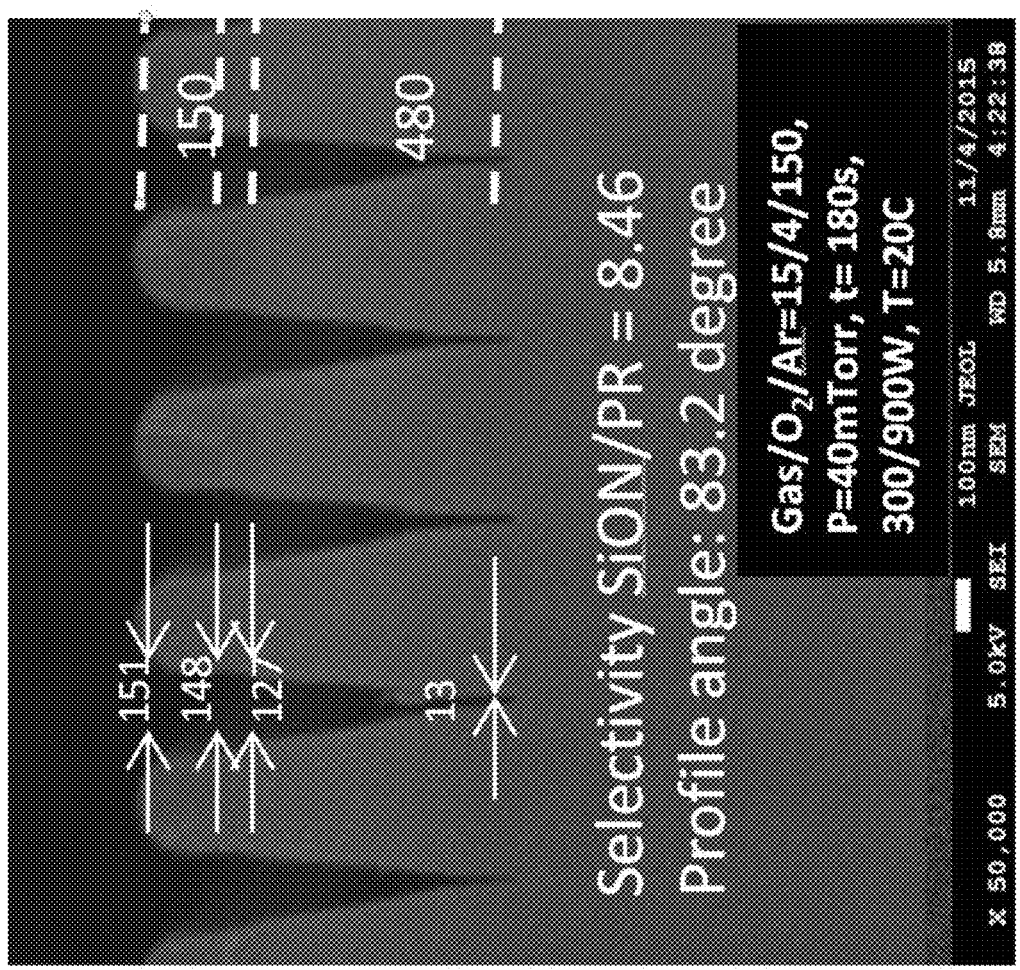
FIG. 6 is a SEM image on a SiON=500 nm patterned wafer after etching with $CHF_3$, Ar and $O_2$.

FIG. 6 is a SEM image on a SiON=500 nm patterned wafer after etching with $CHF_3$, AR and $O_2$. As shown, the trench shows a tapering and pitching structure having the trench width ranged from 13-151 nm. The profile angle is 83.2 degree, where 90 degrees is perfect vertical trench sidewall in SiON layer. The SiON/PR selectivity is calculated by thickness of SiON etched divided by thickness of PR etched. Hence the thicker the PR remaining (nm), the higher the SiON/PR selectivity would be, keeping the same trench depth etched in SiON layer. In this case, the SiON/PR selectivity is 8.46. Here are the etching process conditions for baseline etching gas $CHF_3$. The flow rates of etching gas/$O_2$/Ar are 15, 4 and 150 sccm, respectively; P=40 mTorr, t=180 s, source power of 300 W (27 MHz), bias power of 900 W (2 MHz), bottom T=20° C.

Comparative Example 2

Figure 7:
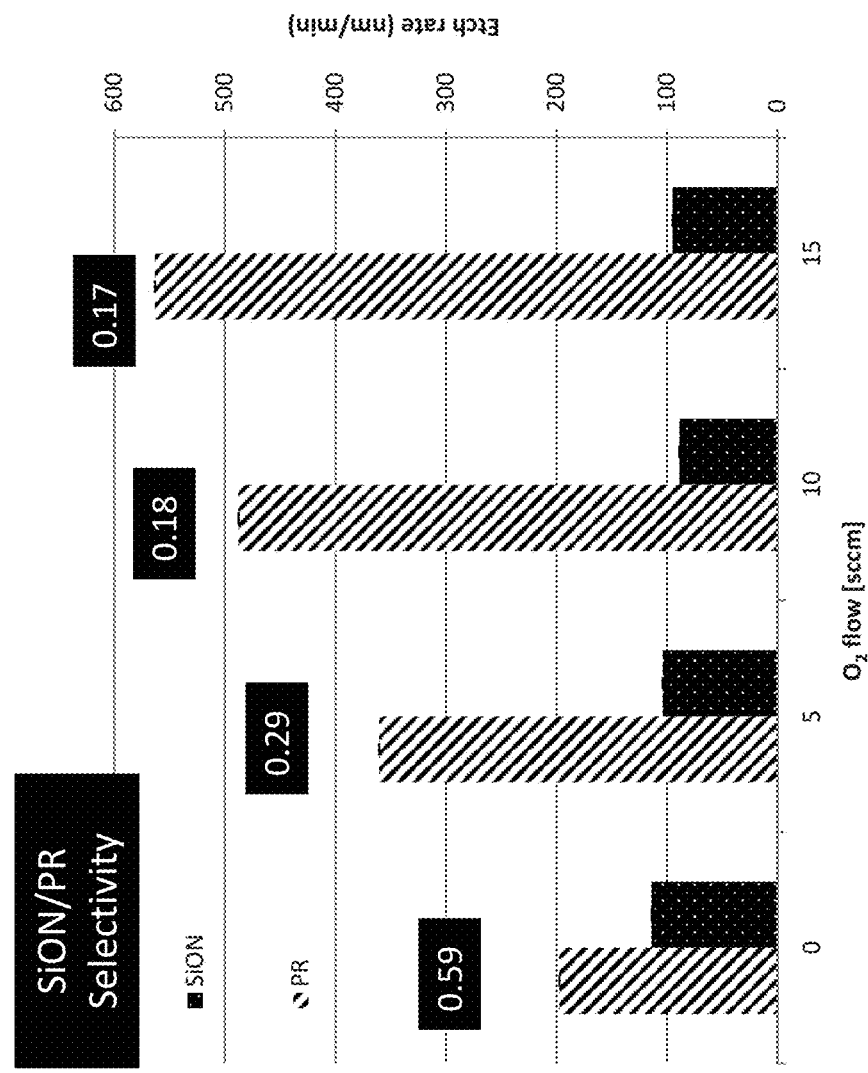
FIG. 7 is a graph demonstrating etch rates of SiON and PR films as a function of oxygen flow rate using $CHF_3$, $CF_4$, $NH_3$, Ar and $O_2$.

FIG. 7 is a graph demonstrating etch rates of SiON and PR films as a function of oxygen flow rate using $CHF_3$, $CF_4$, $NH_3$, Ar and $O_2$. The etching conditions are as follows: the flow rate of $CHF_3$: 15 sccm; the flow rate of $CF_4$: 15 sccm; the flow rate of $NH_3$: 15 sccm; the flow rate of Ar: 250 sccm; the pressure: 30 mTorr; the etching time: 30 s; $RF_{source/bias}$: 300/600 W; the temperature: 20° C. As shown, there is no SiON/PR selectivity higher than 1. Without $O_2$ addition, the selectivity of SiON/PR is still smaller than 1 (0.59). With $O_2$ flow rate increasing to 15 sccm, PR etch rate is increased showing the PR layer is damaged and the SiON/PR selectivity decreases dramatically. Since no polymer deposition is formed on the PR layer, $O_2$ addition results in more O species in the plasma to etch away the PR. When $O_2$ flow rate reaches to 15 sccm, the PR may be completely etched away. The purpose of this example is to make a comparison with prior art U.S. Pat. Nos. 6,569,774 and 7,153,779 to Trapp, showing that the use of traditional etch hydrofluorocarbons and ammonia, does not provide the etch performance required for the current application.

Comparative Example 3

Figure 8:
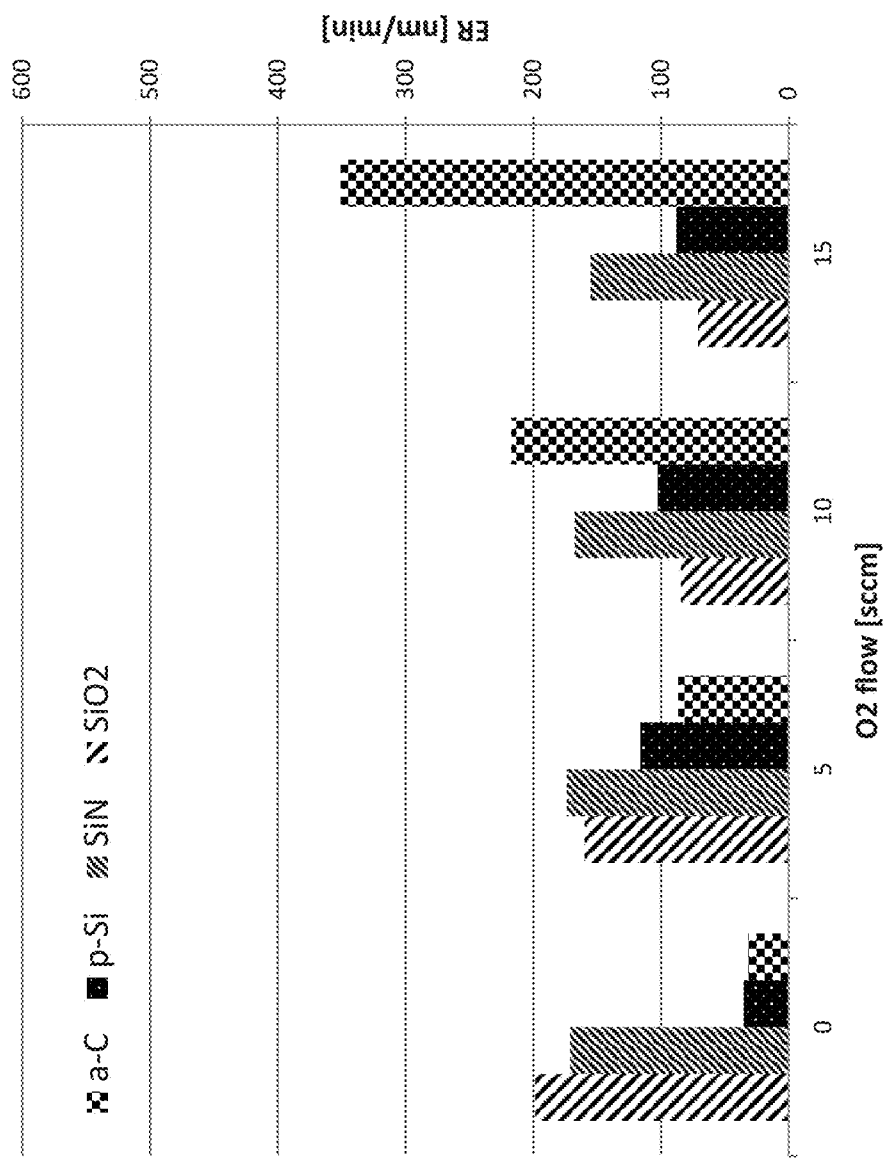
FIG. 8 is a graph demonstrating etch rates of $SiO_2$, SiN, p-Si and a-C using traditional hydrofluorocarbons ($CF_4$ and $CHF_3$), ammonia ($NH_3$), Ar and $O_2$ to etch ONON and OPOP.

FIG. 8 is a graph demonstrating etch rates of $SiO_2$, SiN, p-Si and a-C using traditional hydrofluorocarbons ($CF_4$ and $CHF_3$), ammonia ($NH_3$), Ar and $O_2$ (with a flow rate 0-15 sccm) to etch ONON and OPOP for 3D NAND application. Table 2 lists etching selectivity of $SiO_2$ versus SiN, SiN versus $SiO_2$, $SiO_2$ versus a-C and $SiO_2$ versus p-Si with different $O_2$ flow rates. The etching conditions are as follows: the flow rate of $CHF_3$: 15 sccm; the flow rate of $CF_4$: 15 sccm; the flow rate of $NH_3$: 15 sccm; the flow rate of Ar: 250 sccm; the pressure: 30 mTorr; the etching time: 30 s; $RF_{source/bias}$: 7500/1500 W; the temperature: 20° C.

TABLE 2

| Selectivity versus $O_2$ flow rates using $C_2H_4F_3N$ | | | | |
|---|---|---|---|---|
| $O_2$ flow (sccm) | $SiO_2$/SiN | SiN/$SiO_2$ | $SiO_2$/a-C | $SiO_2$/p-Si |
| 15 | 0.46 | 2.19 | 0.20 | 0.81 |
| 10 | 0.50 | 1.99 | 0.39 | 0.82 |
| 5 | 0.92 | 1.09 | 1.84 | 1.38 |
| 0 | 1.16 | 0.86 | 6.21 | 5.64 |

As shown, with $O_2$ flow rate at 0 sccm, the selectivity of $SiO_2$/SiN, SiN/$SiO_2$ are close to 1:1, and the selectivity of $SiO_2$/a-C is 6.2. However, with $NH_3$ there is an increase of roughness surface etching $SiO_2$/SiN, SiN/$SiO_2$, which may be seen in Example 5 that follows.

Example 1

Figure 9:
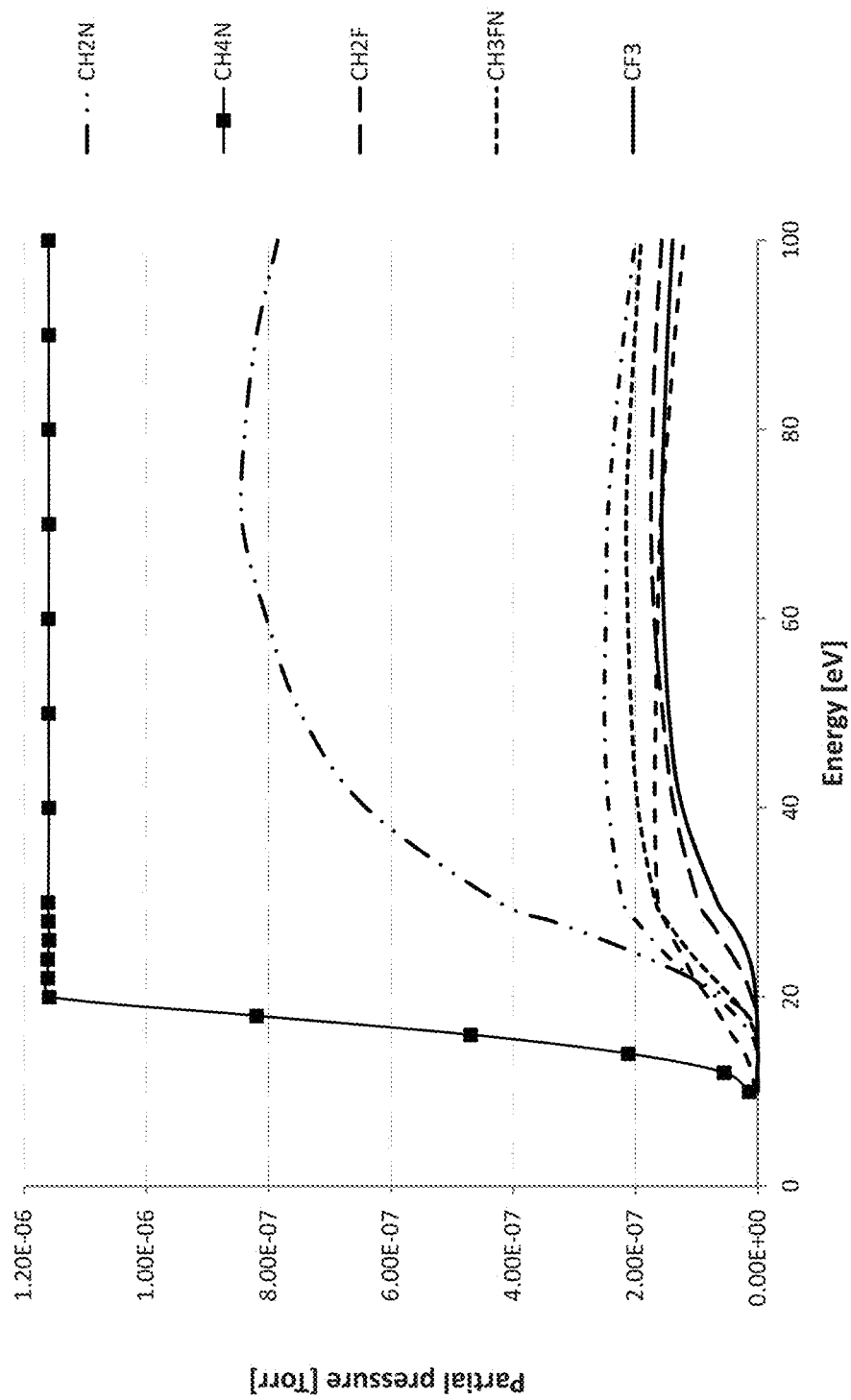
FIG. 9 is a graph demonstrating the electron impact ionization energy versus pressure of the species produced by $C_2H_4F_3N$.

FIG. 9 is a graph demonstrating the electron impact ionization energy versus pressure of the species produced by $C_2H_4F_3N$. The x-axis represents electron energy and y-axis represents the partial pressure of the fragment species. The dominant fragments or ionized products produced are $CH_4N$ and $CH_2N$ for $C_2H_4F_3N$, which contain C, H and —$NH_2$ group that lead to deposit on the PR layer during plasma etching. Furthermore, the species $CH_4N$, $CH_2N$, $C_2H_2F_2N$ and $CH_3FN$ have lower F:C and/or F:H ratio than the fragments from $CHF_3$, which lead to higher polymer deposition rate and may improve selectivity.

Figure 10:
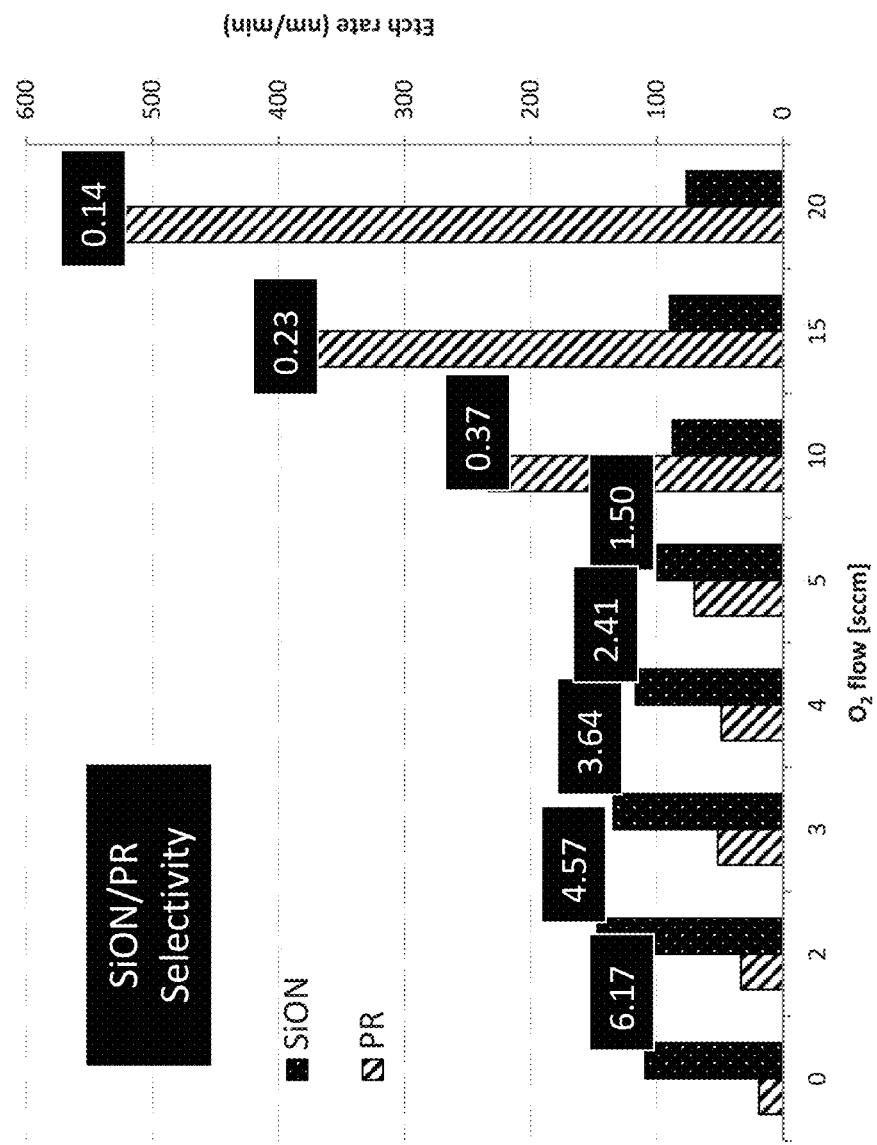
FIG. 10 is a graph demonstrating etch rates of SiON and PR films as a function of oxygen flow rate using $C_2H_4F_3N$, Ar and $O_2$.

FIG. 10 is a graph demonstrating etch rates of SiON and PR films as a function of oxygen flow rate using $C_2H_4F_3N$, Ar and $O_2$. The etching conditions are as follows: the flow rate of $C_2H_4F_3N$ was 15 sccm; the flow rate of Ar was 250 sccm; the pressure was 30 mTorr; the etching time was 30 s; $RF_{source/bias}$ were 300/600 W; and the temperature was 20° C. Without and with low $O_2$ flow rate at 0-5 sccm, the SiON/PR selectivity is high showing the PR layer is less damaged. When the $O_2$ flow rate is increased (i.e., larger than 10 sccm), the PR etch rate is increased and significantly larger than that of SiON layer, showing the PR layer is damaged and the SiON/PR selectivity decreases dramatically. $O_2$ addition results in more O species in the plasma that etches away the PR. Thus, without the addition of $O_2$ and with dilute $O_2$ (i.e., less than 5 sccm), $C_2H_4F_3N$ may be suitable for selectively etching SiON film over PR film.

Figure 11B:
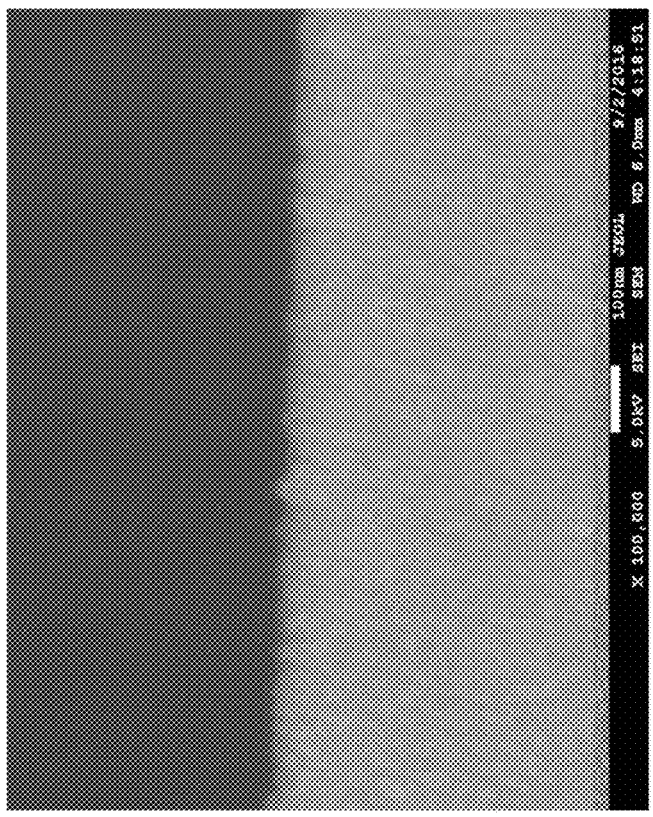
FIG. 11b is a SEM image of SiON surface after etching with $C_2H_4F_3N$, Ar and with addition of $O_2$.
Figure 11A:
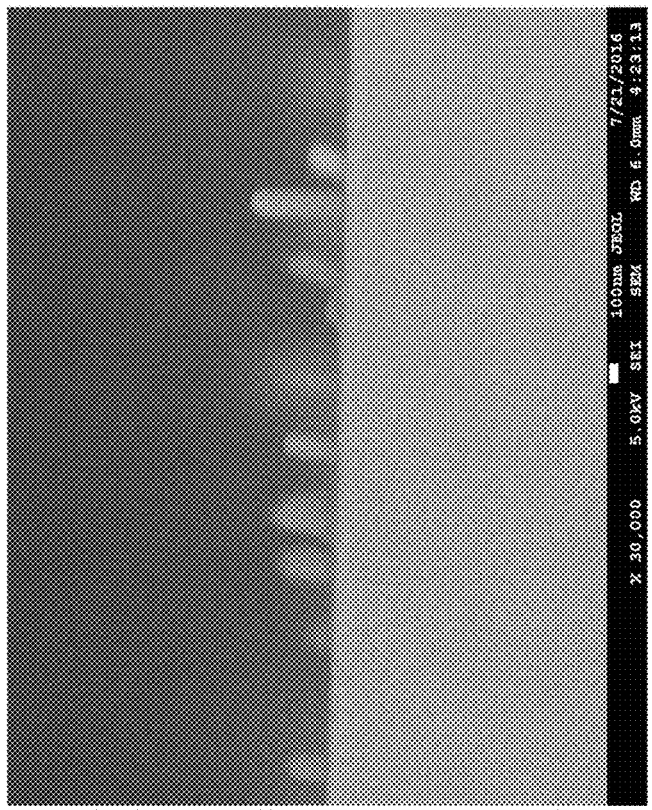
FIG. 11a is a SEM image of SiON surface after etching with $C_2H_4F_3N$ and Ar without addition of $O_2$.

FIG. 11a is a SEM cross-section image of SiON surface after etching with $C_2H_4F_3N$ and Ar without addition of $O_2$. The surface appears rough and not uniform. FIG. 11b is a SEM cross-section image of SiON surface after etching with $C_2H_4F_3N$ and Ar with $O_2$ flow rate 2 sccm. The surface appears flat and smooth. The same SiON smooth surface has been observed within $O_2$ flow rate in the range of 2 to 5 sccm. The etching conditions are as follows. The flow rate of $C_2H_4F_3N$ was 15 sccm; the flow rate of Ar was 250 sccm; the pressure was 30 mTorr; the etching time was 30 s; $RF_{source/bias}$ were 300/600 W; and the temperature was 20° C.

This example shows that using $C_2H_4F_3N$ as etching compound, in addition to $O_2$, SiON is selectively etched versus the PR mask, without causing damage on the photoresist, neither increasing the surface roughness of SiON.

Example 2

Figure 12:
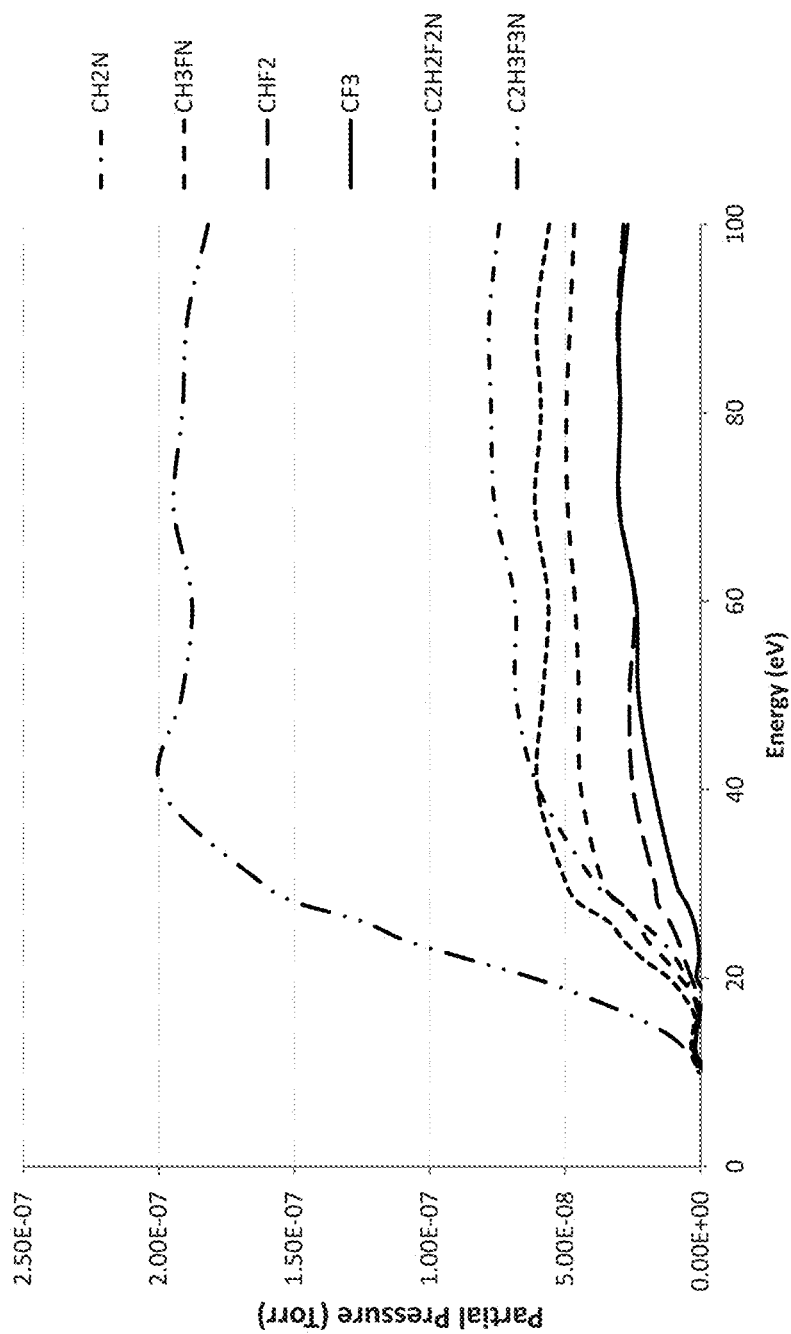
FIG. 12 is a graph demonstrating the electron impact ionization energy versus pressure of the species produced by $C_3H_3F_6N$.

FIG. 12 is a graph demonstrating the electron impact ionization energy versus pressure of the species produced by $C_3H_3F_6N$. The x-axis represents electron energy and y-axis represents the partial pressure of the fragment species. The primary species, $C_2H_3F_3N$ and $CH_2N$ for $C_3H_3F_6N$ has a low F/C and F/H ratio and thus a polymer deposition occurs during etching with $C_3H_3F_6N$, which contain —$NH_2$ group and have lower F:C and/or F:H ratio than the fragments from $CHF_3$, which lead to higher polymer deposition rate and may improve selectivity.

Figure 13:
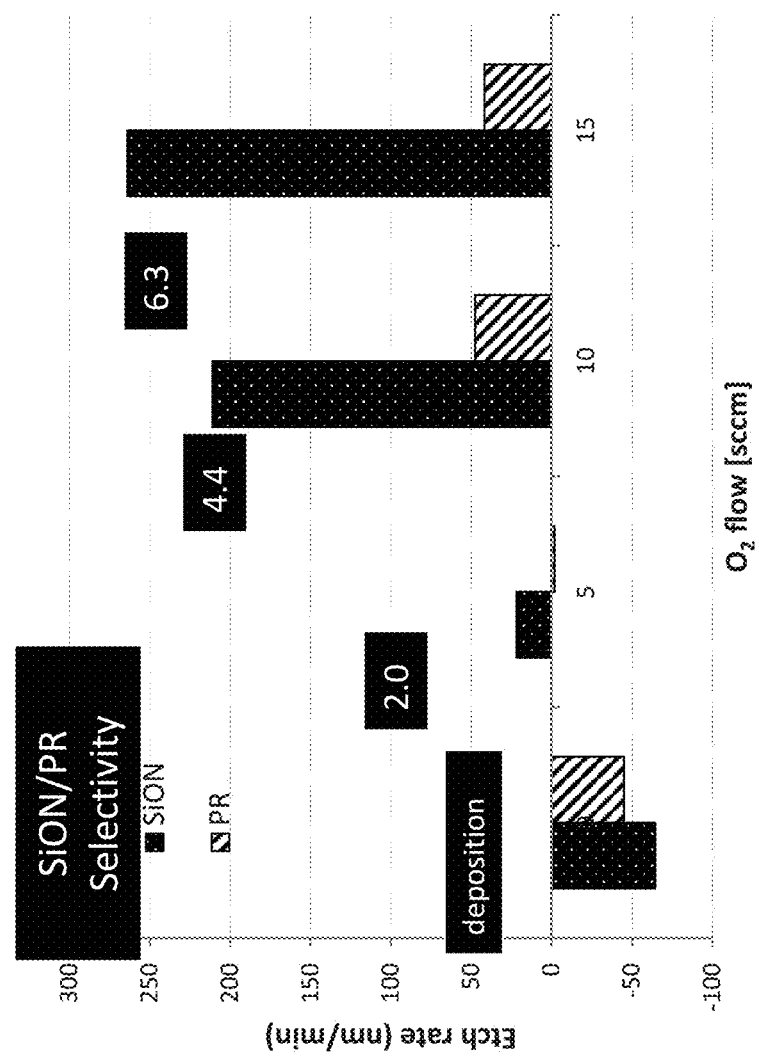
FIG. 13 is a graph demonstrating etch rates of SiON and PR films as a function of oxygen flow rate using $C_3H_3F_6N$, Ar and $O_2$.

FIG. 13 is a graph demonstrating etch rates of SiON and PR films as a function of oxygen flow rate using $C_3H_3F_6N$, Ar and $O_2$. The positive y-axis represents etch rates while the negative y-axis represents deposition rates; the x-axis is $O_2$ flow rate in sccm; the $C_3H_3F_6N$ flow rate is fixed at 15 sccm, the flow rate of Ar is 250 sccm while the $O_2$ flow rate is varied from 0 to 15 sccm. As shown, the etch rate results show SiON and PR layers all have extensive polymer depositions without $O_2$ addition. Whereas, the SiON/PR selectivity increases with the increase of $O_2$ flow rate. The SiON/PR selectivity is 6.3 with $O_2$=15 sccm which is significantly improved comparing to traditional etching gas $CHF_3$.

Figure 14:
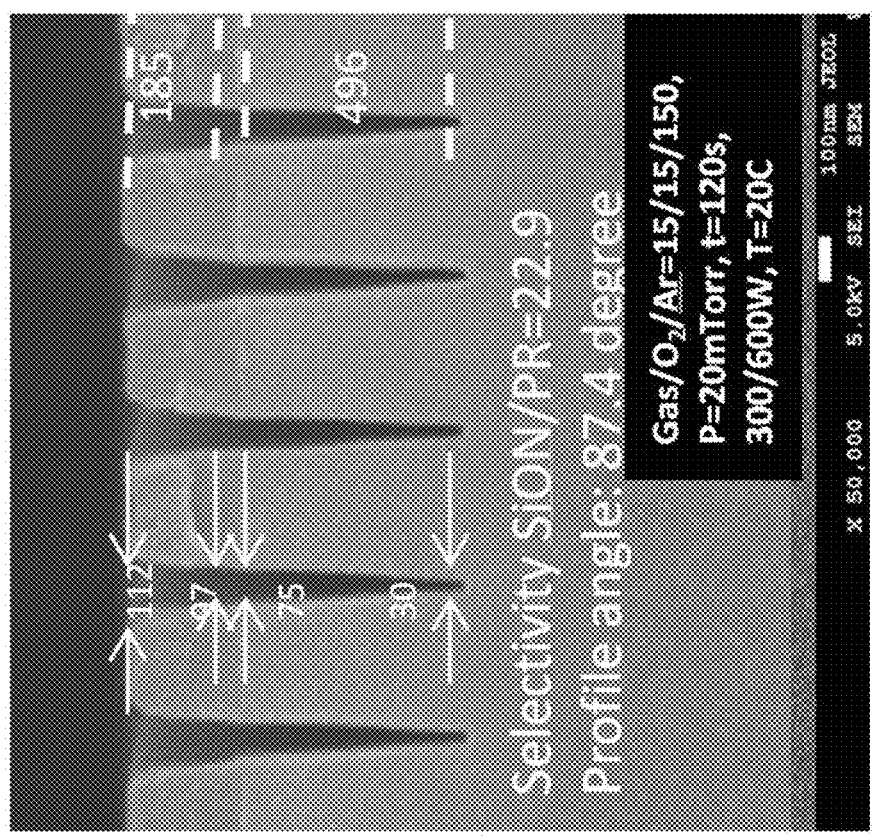
FIG. 14 is a SEM image after etching a patterned wafer with $C_3H_3F_6N$, Ar and $O_2$.

FIG. 14 is a SEM image after etching a patterned wafer with $C_3H_3F_6N$, Ar and $O_2$. The SEM image was taken on a SiON=500 nm patterned wafer with etching time 120 s. The SEM image shown in FIG. 14 illustrates an optimized patterned structure with $C_3H_3F_6N$ etching compound. The most important messages delivered in this image are the SiON/PR selectivity is 22.9 and the profile angle is 87.4, showing a more desirable pattern structure for 3D NAND applications. The etching conditions for this image are as follows. The flow rates of $C_3H_3F_6N$ etching gas/$O_2$/Ar=15/15/150 sccm, P=20 mTorr, t=120 s, $RF_{source/bias}$ 300/600 W, T=20° C.

Example 3

Figure 15:
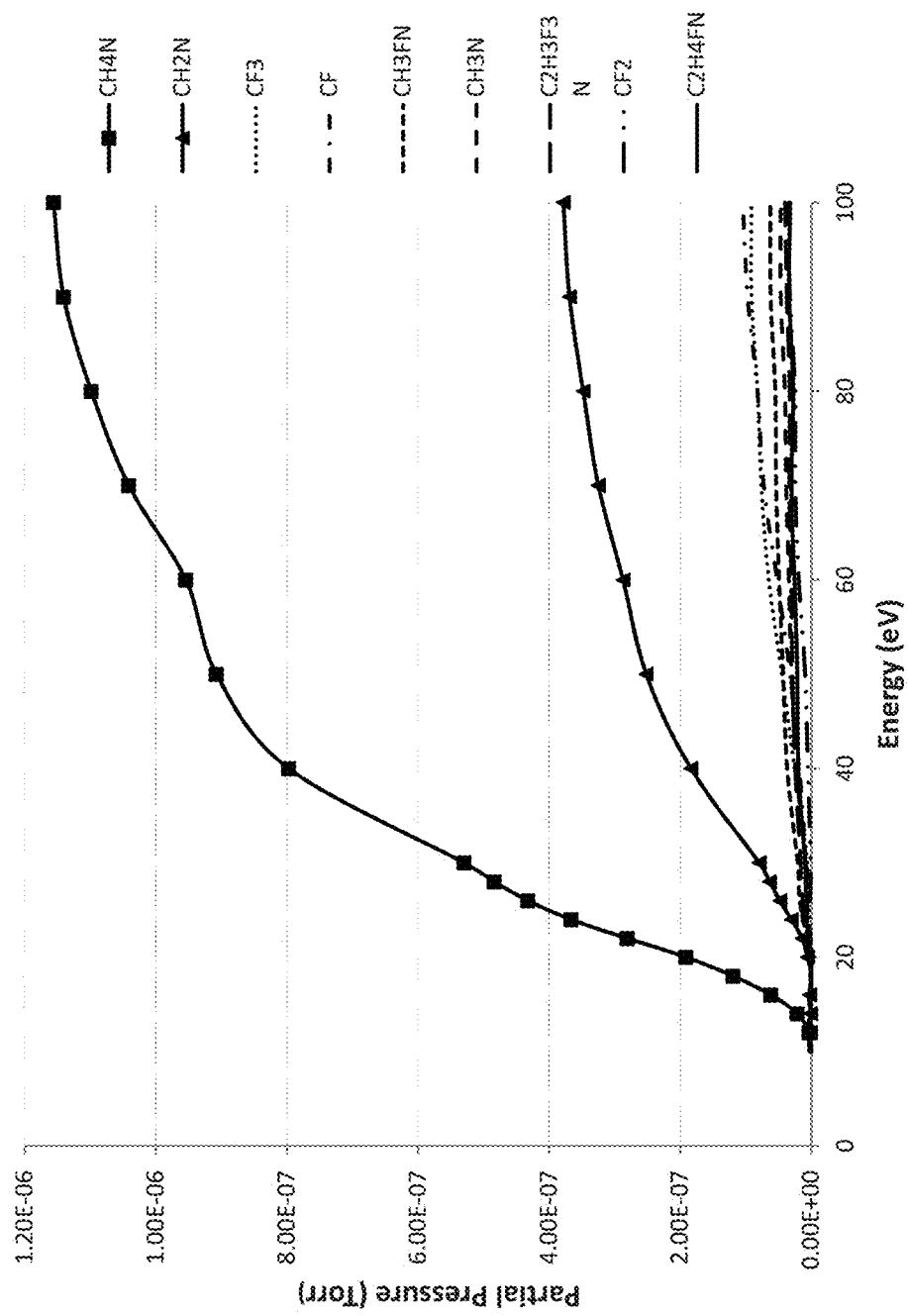
FIG. 15 is a graph demonstrating the electron impact ionization energy versus pressure of the species produced by $C_3H_4F_5N$.

FIG. 15 is a graph demonstrating the electron impact ionization energy versus pressure of the species produced by $C_3H_4F_5N$. The x-axis represents electron energy and y-axis represents the partial pressure of the fragment species. The primary species, $CH_4N$ and $CH_2N$ for $C_3H_4F_5N$ has a low F/C and F/H ratio and thus a polymer deposition occurs during etching with $C_3H_4F_5N$.

Figure 16:
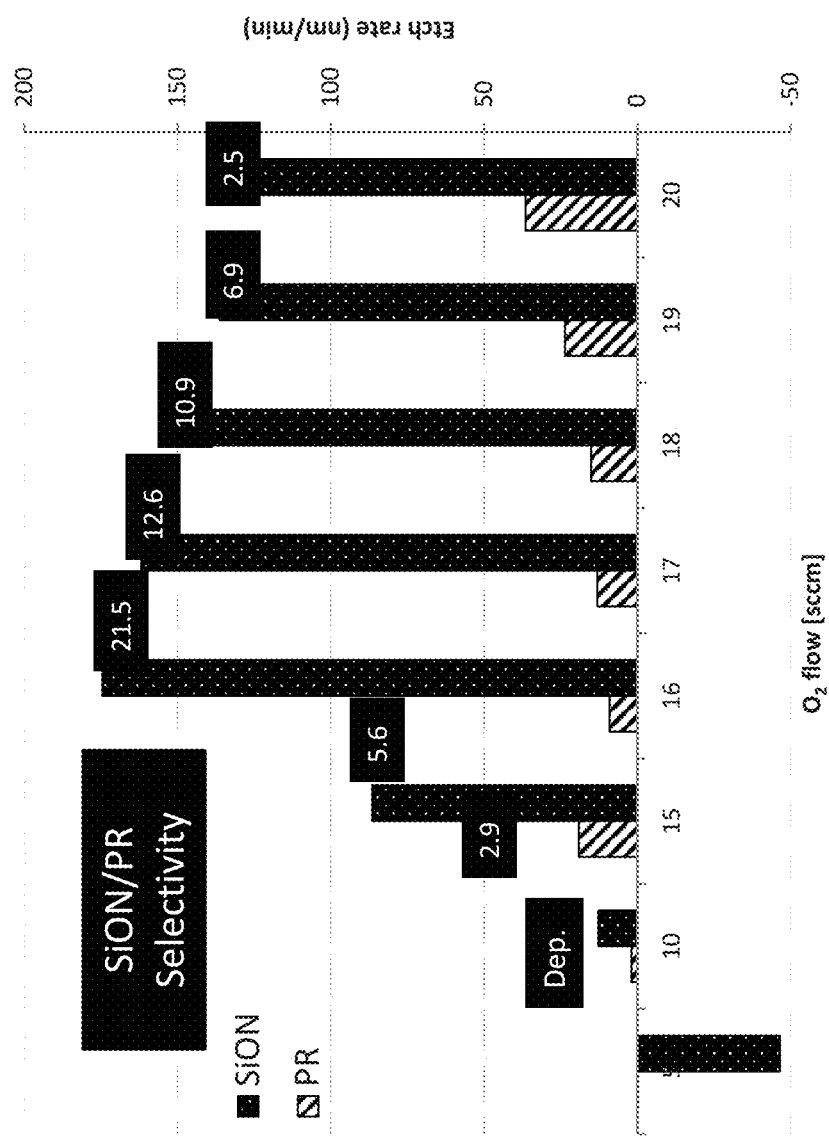
FIG. 16 is a graph demonstrating etch rates of SiON and PR films as a function of oxygen flow rate using $C_3H_4F_5N$, Ar and $O_2$.

FIG. 16 is a graph demonstrating etch rates of SiON and PR with $C_3H_4F_5N$, Ar with various $O_2$ flow rate. As shown, the positive y-axis represents etch rates while the negative y-axis represents deposition rates; the x-axis is $O_2$ flow rate in sccm; the $C_3H_4F_5N$ flow rate is fixed at 15 sccm, the flow rate of Ar is 250 sccm while the $O_2$ flow rate is varied from 0 to 20 sccm. As shown, when no oxygen is added (0 sccm $O_2$ condition), $C_3H_4F_5N$ deposits on SiON. With the addition of $O_2$, the SiON/PR selectivity is increased and peaks at $O_2$ flow rate=16 sccm, achieving 21.5. More addition of $O_2$ then reduces the selectivity of SiON/PR a little bit, but still maintains a good range of the selectivity of SiON/PR. Within $O_2$ flow rate in the range of 16 to 20, $C_3H_4F_5N$ has less damage to PR.

Figure 17B:
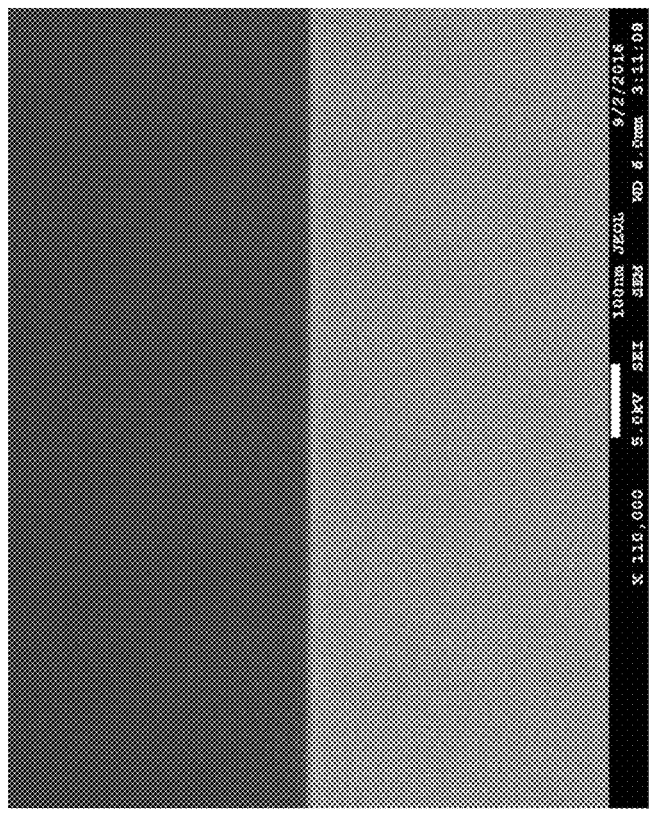
FIG. 17b is a SEM image of SiON surface after etching with $C_3H_4F_5N$, Ar and 16 sccm of $O_2$.
Figure 17A:
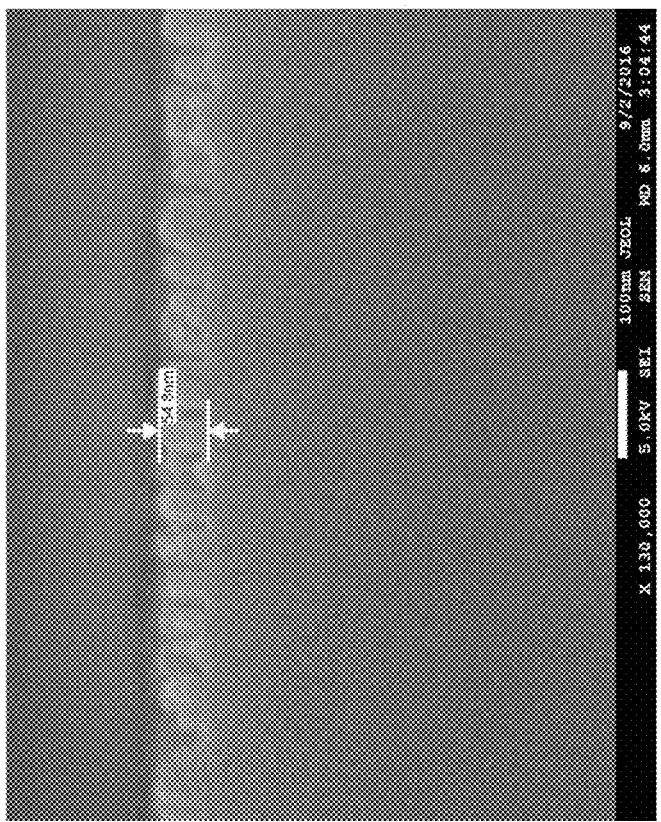
FIG. 17a is a SEM image of SiON surface after etching with $C_3H_4F_5N$, Ar and 15 sccm of $O_2$.

FIG. 17a is a SEM image of SiON surface after etching with $C_3H_4F_5N$, Ar and 15 sccm of $O_2$. The surface appears rough and not uniform. FIG. 17b is a SEM image of SiON surface after etching with $C_3H_4F_5N$, Ar and 16 sccm of $O_2$, which is the condition were the highest SiON/PR selectivity has been achieved. The surface appears flat and smooth. The same SiON smooth surface has been observed within $O_2$ flow rate in the range of 16 to 20 sccm. The etching conditions are as follows: the flow rate of $C_3H_4F_5N$ was 15 sccm; the flow rate of Ar was 250 sccm; the pressure was 30 mTorr; the etching time was 30 s; $RF_{source/bias}$ were 300/600 W; and the temperature was 20° C.

This example shows that using $C_2H_4F_3N$ as etching compound SiON is selectively etched versus the PR mask, without causing damage on the photoresist, neither increasing the surface roughness of SiON.

Figure 18:
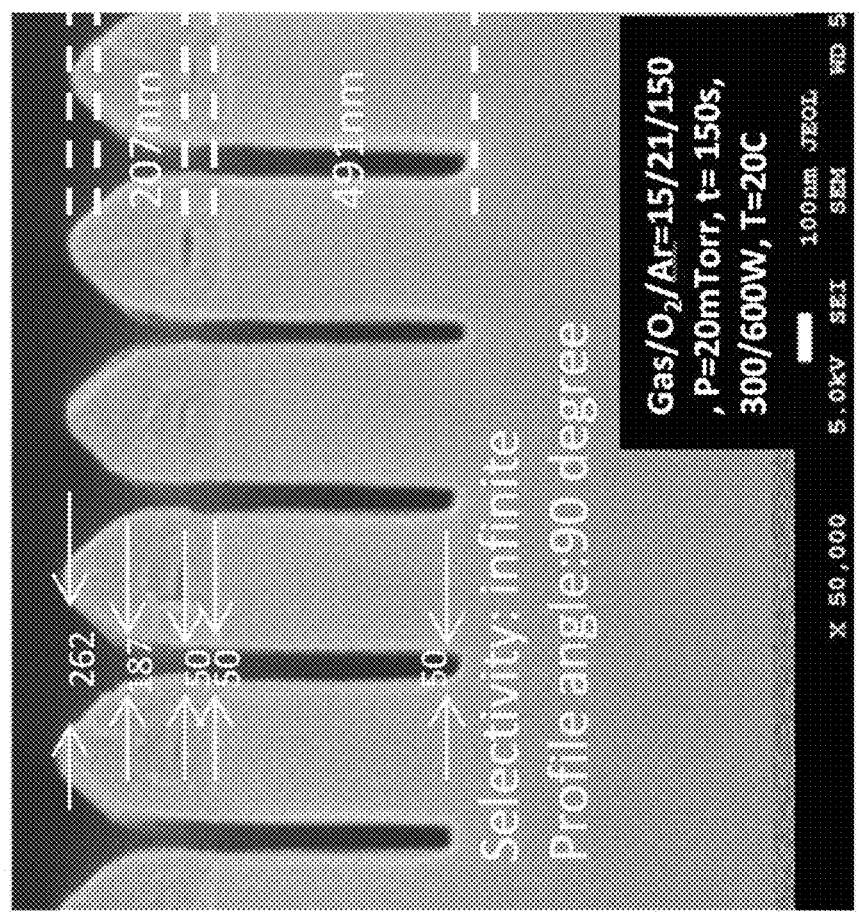
FIG. 18 is a SEM image after etching a patterned wafer with $C_3H_4F_5N$, Ar and $O_2$.

FIG. 18 is a SEM image after etching a patterned wafer with $C_3H_4F_5N$, Ar and $O_2$. The image is a SEM image on a SiON=500 nm patterned wafer with etching time 150 s. The initial SEM image with a different patterned wafer with different etching time shows an undesirable etching profile where the PR layer is damaged. However, this SEM image shows optimized patterned structure dry etched with $C_3H_4F_5N$ etching compound with infinite SiON/PR selectivity, and 90-degree profile angle. There is deposition on top of PR (16 nm). However, no undesired pattern formation after dry etching was observed with $C_3H_4F_5N$, such as no overhanging inside trench and blocking trench openings were observed. The etching condition for this SEM image is as follows. The flow rates of $C_3H_4F_5N$ gas/$O_2$/Ar=15/21/150 sccm, P=20 mTorr, t=150 s, $RF_{source/bias}$ 300/600 W, bottom T=20° C.

Example 4

Figure 19:
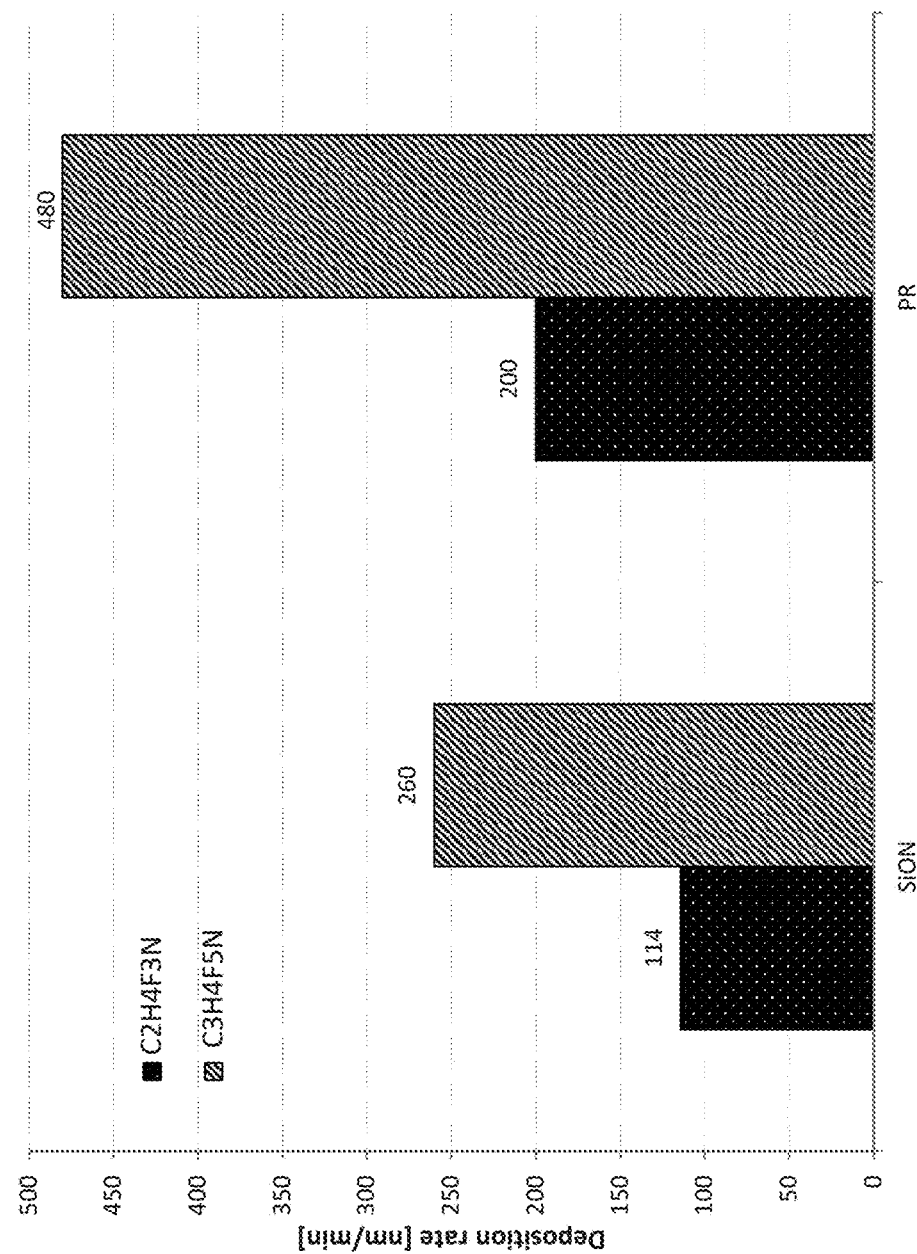
FIG. 19 is a graph demonstrating deposition rates on SiON and PR substrates with $C_2H_4F_3N$ and $C_3H_4F_5N$, respectively.

FIG. 19 is a graph demonstrating deposition rates on SiON and PR substrates with $C_2H_4F_3N$ and $C_3H_4F_5N$, respectively. In FIG. 19, the y-axis represents the deposition rate in nm/min and the x-axis shows the PR and SiON substrates. Both $C_2H_4F_3N$ and $C_3H_4F_5N$ show higher deposition on PR film than SiON film. As described above, the fluorocarbon polymer film contains —$NH_2$, which protects PR film from the bombardment of ions generated under plasma and favors high SiON/PR selectivity. $C_3H_4F_5N$ is more polymerizing, around the double, than $C_2H_4F_3N$ on both SiON and PR, possibly due to the longer carbon chain in $C_3H_4F_5N$ and generation of larger fragments in the plasma.

Example 5

Figure 20:
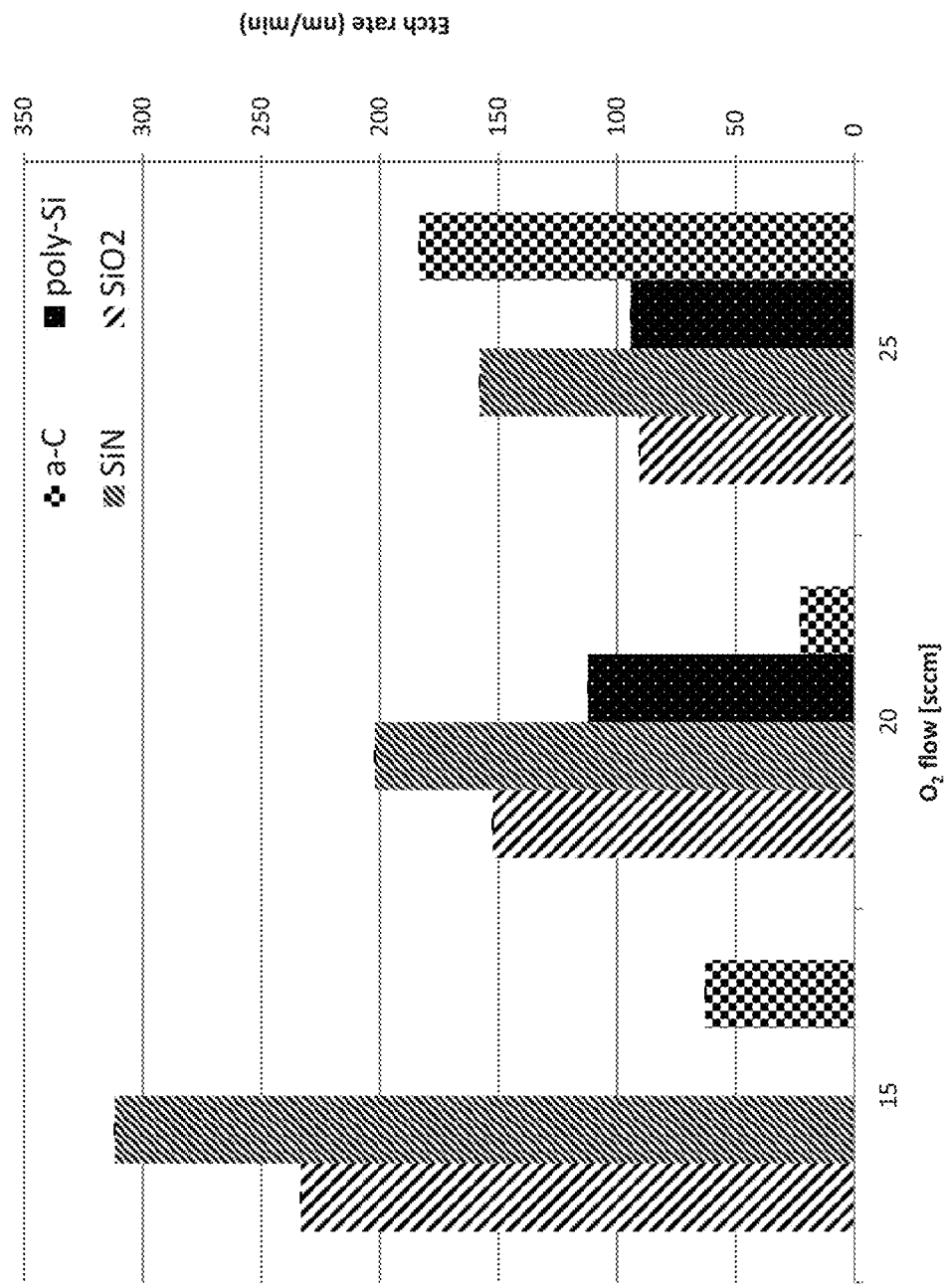
FIG. 20 is a graph demonstrating etch rates of $SiO_2$, SiN, p-Si and a-C using $C_3H_4F_5N$ and Ar with various $O_2$ flow rate for ONON and OPOP etching in 3D NAND application.

FIG. 20 is a graph demonstrating etch rates of $SiO_2$, SiN, p-Si and a-C using $C_3H_4F_5N$ and Ar with various $O_2$ flow rate for ONON and OPOP etching in 3D NAND application. Table 3 lists $C_3H_4F_5N$ selectivity of $SiO_2$ versus SiN, SiN versus $SiO_2$, $SiO_2$ versus a-C and $SiO_2$ versus p-Si with different $O_2$ flow rates. The etching conditions are as follows: the flow rate of $C_3H_4F_5N$ 15 sccm; the flow rate of Ar: 250 sccm; the pressure: 30 mTorr; the etching time: 30 s; $RF_{source/bias}$: 7500/1500 W; the temperature: 20° C.

TABLE 3

Selectivity versus $O_2$ flow rates using $C_3H_4F_5N$

| $O_2$ flow (sccm) | $SiO_2$/SiN | SiN/$SiO_2$ | $SiO_2$/a-C | $SiO_2$/p-Si |
|---|---|---|---|---|
| 25 | 0.57 | 1.74 | 0.49 | 0.96 |
| 20 | 0.75 | 1.33 | 6.69 | 1.36 |
| 15 | 0.75 | 1.34 | 3.72 | depo |

As shown, with $O_2$ flow rate at 20 sccm, the selectivity of $SiO_2$/SiN, SiN/$SiO_2$ and $SiO_2$/p-Si are within the range of 1:2 to 2:1, close to 1:1, and the selectivity of $SiO_2$/a-C is 6.69, using $C_3H_4F_5N$ as an etching gas. Thus, $C_3H_4F_5N$ is suitable for using as an etching compound to selectively etch silicon-containing layers versus a-C hard mask layer, such as, $SiO_2$, SiN, and p-Si layers, for ONON and OPOP etching in 3D NAND application.

In addition, the roughness of the surfaces after $C_3H_4F_5N$ etch were measured and compared with the one of the pristine materials and with the surface etched with the etch compounds listed in the comparative Example 3 ($CF_4$+$CHF_3$+$NH_3$). Atomic Force Microscopy (AFM) from NX PARK 10 was used in non-contact mode to evaluate the surface morphology of the different substrates ($SiO_2$, SiN, p-Si, a-C) before and after the etching process. The parameter studied to evaluate the roughness was Root Mean Square roughness (Rq). Among the all $O_2$ flow rate condition studied ($O_2$ ranging from 0-25 sccm), have been selected the conditions showing the most promising result for 3D NAND, ONON or OPOP, applications: in case of etching with $CF_4$+$CHF_3$+$NH_3$, $O_2$=0 sccm was chosen; while in case of $C_3H_4F_5N$, $O_2$=20 sccm was chosen. The results are showed in Table 4.

TABLE 4

Roughness (Rq) of the pristine substrates and after etching

| | Roughness: Rq (nm) | | | |
|---|---|---|---|---|
| | $SiO_2$ | SiN | p-Si | a-C |
| Pristine | 0.61 | 2.89 | 5.79 | 0.2 |
| After etch with $CF_4$ + $CHF_3$ + $NH_3$ | 6.13 | 2.49 | 5.57 | 0.48 |
| After etch with $C_3H_4F_5N$ | 0.52 | 2.67 | 3.31 | 0.23 |

Comparing the roughness values of the pristine substrates with the one after $CF_4$+$CHF_3$+$NH_3$, a high increase on the surface roughness of $SiO_2$ and a slightly increase on the a-C surface were observed. While after etching with $C_3H_4F_5N$, lower to comparable results are shown for $SiO_2$, SiN and a-C versus the pristine material, and reduction of surface roughness is observed on the surface of p-Si.

Example 6

Figure 21:
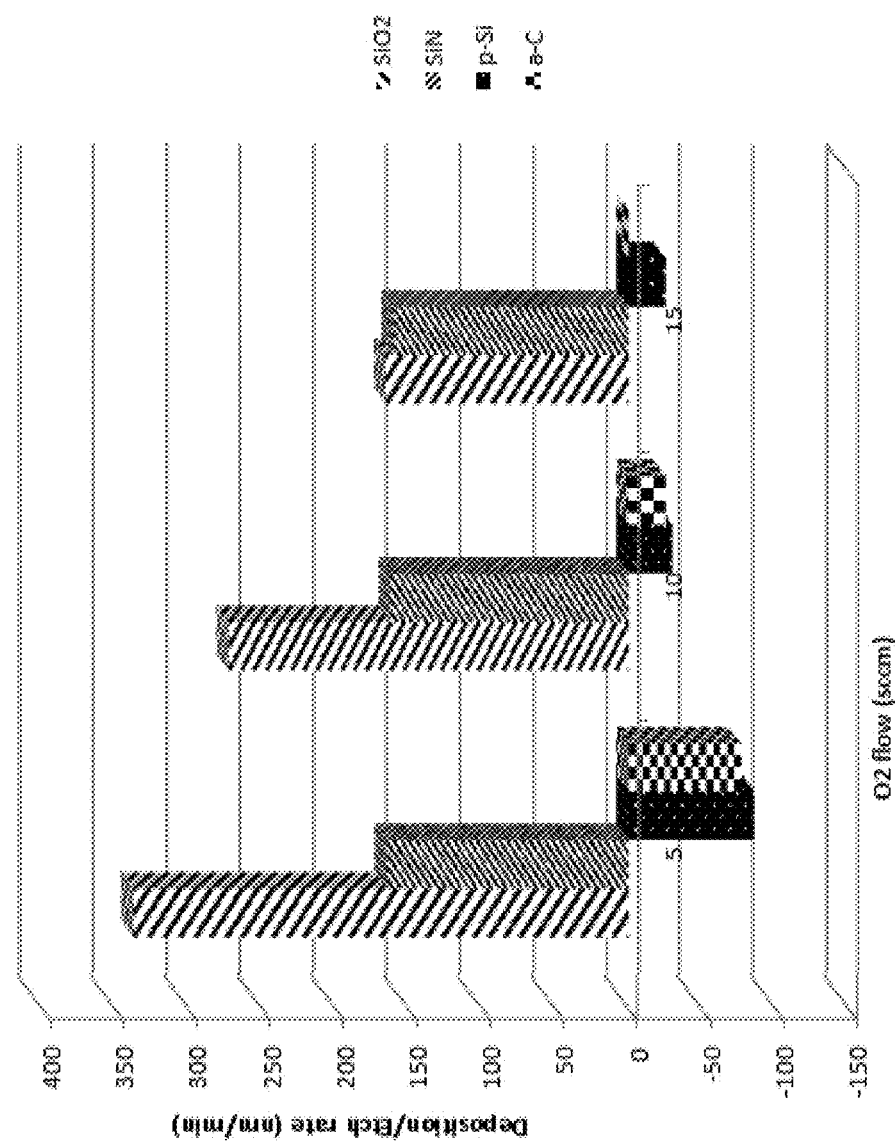
FIG. 21 is a graph demonstrating etch rates of $SiO_2$, SiN, p-Si and a-C with $C_3H_3F_6N$ and Ar with various $O_2$ flow rate on a planar wafer.

FIG. 21 is a graph demonstrating etch rates of $SiO_2$, SiN, p-Si and a-C with $C_3H_3F_6N$, Ar with various $O_2$ flow rate on a planar wafer. The positive y-axis represents etch rates while the negative y-axis represents deposition rates; the x-axis is $O_2$ flow rate in sccm; the $C_3H_3F_6N$ flow rate is fixed at 15 sccm while the $O_2$ flow rate is varied from 5 to 15 sccm; the flow rate of Ar: 250 sccm; the pressure: 30 mTorr; the etching time: 30 s; $RF_{source/bias}$: 7500/1500 W; the temperature: 20° C. Table 5 lists $C_3H_3F_6N$ selectivity of $SiO_2$ versus SiN, SiN versus $SiO_2$, $SiO_2$ versus a-C and $SiO_2$ versus p-Si with different $O_2$ flow rates. As shown, the etch rates of SiN and SiO using $C_3H_3F_6N$ are nearly the same and in the range of 1:2 to 2:1, close to 1:1, while the depositions occur on a-C layer and p-Si layer. Hence, the $SiO_2$/a-C and $SiO_2$/a-C selectivity are infinite. Thus, $C_3H_3F_6N$ is not selectively etch $SiO_2$ and SiN layers with the addition of $O_2$, while preserving the amorphous carbon hard mask; therefore, it is suitable for using as an etching compound to selectively etch silicon-containing layers versus a-C hard mask layer, such as, $SiO_2$ and SiN layers, for ONON etching in 3D NAND application.

TABLE 5

Selectivity versus $O_2$ flow rates using $C_3H_3F_6N$

| $O_2$ flow (sccm) | $SiO_2$/SiN | SiN/$SiO_2$ | $SiO_2$/a-C | $SiO_2$/p-Si |
|---|---|---|---|---|
| 15 | 1.03 | 0.97 | infinite | infinite |
| 10 | 1.68 | 0.60 | infinite | infinite |
| 5 | 2.05 | 0.49 | infinite | infinite |

In summary, the disclosed hydrofluorocarbon etching compounds having —$NH_2$ functional group, such as, $C_2H_4F_3N$, $C_3H_3F_6N$, $C_3H_4F_5N$ as well as their isomers, which have high selectivity of SiON/PR, with less to no PR deformation, and which have $SiO_2$/SiN or $SiO_2$/p-Si selectivity close to 1:1, and SiO2/a-C selectivity up to infinite, are highly desirable for 3D NAND and DRAM applications. The disclosed hydrofluorocarbon etching compounds having —$NH_2$ functional group show less to no damage of the surfaces after etch, and no surface roughness increase after etch, compared to traditional etch gas $CHF_3$+$CF_4$+$NH_3$. In fact, lower to similar surface roughness has been observed compared to pristine surfaces. The disclosed hydrofluorocarbon etching compounds having —$NH_2$ functional group show higher (infinite on pattern wafers) SiON/PR selectivity than the traditional etching gas, such as $CHF_3$ and $CHF_3$+$CF_4$+$NH_3$, by keeping a smooth SiON surface. Besides selectively etching SiON/PR, the disclosed hydrofluorocarbon etching compounds having —$NH_2$ functional group also not selectively etch other silicon-containing films, such as, SiO, SiN, p-Si, amorphous silicon, crystalline silicon, low-k SiCOH, SiOCN, $Si_aO_bH_cC_dN_e$, where a>0; b, c, d and e≥0, or combinations thereof, SiO/SiN, SiO/p-Si, etc. versus PR and amorphous carbon, doped amorphous carbon, such as amorphous carbon doped with boron, nitrogen, sulfur, chlorine, fluorine or metals (Al, Zr, Ti, W), used in 3D NAND and DRAM applications. In addition, an improvement from the process point of view has to be considered, since the hydrofluorocarbon etching compounds having —$NH_2$ functional group are able to obtain better etching results than multiple mixture of traditional etching gas.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for etching a structure of silicon-containing layers disposed over a substrate, the structure having a dielectric anti-reflective coating (DARC) layer deposited over alternating layers of a first silicon-containing layer and a second silicon-containing layer, a patterned photoresist layer formed over the DARC layer, and a hardmask layer formed in between the DARC layer and the alternating layers, the method comprising the steps of:

selectively plasma etching the DARC layer versus the patterned photoresist layer using a hydrofluorocarbon etching compound selected from the group consisting of 2,2,2-Trifluoroethanamine ($C_2H_4F_3N$), 1,1,2-Trifluoroethan-1-amine (Iso-$C_2H_4F_3N$), 2,2,3,3,3-Pentafluoropropylamine ($C_3H_4F_5N$), 1,1,1,3,3-pentafluoro-2-Propanamine (Iso-$C_3H_4F_5N$), 1,1,1,3,3-Pentafluoro-(2R)-2-Propanamine (Iso-2R—$C_3H_4F_5N$) and 1,1,1,3,3-Pentafluoro-(2S)-2-Propanamine (Iso-2S—$C_3H_4F_5N$) to produce apertures in the DARC layer with less to no patterned photoresist layer deformation;

selectively plasma etching the hardmask layer exposed by the apertures in the DARC layer versus the patterned photoresist layer and the DARC layer with an etching gas suitable for etching the hardmask layer to extend the apertures through the hardmask layer; and selectively plasma etching the alternating layers exposed by the apertures in the hardmask layer versus the patterned photoresist layer, the DARC layer and the hardmask layer using the hydrofluorocarbon etching compound to extend the apertures through the alternating layers with less to no damage of the surfaces of the alternating layers, wherein the first silicon-containing layer and the second silicon-containing layer are etched non-selectively.

2. The method of claim 1, wherein the hydrofluorocarbon etching compound is 2,2,2-Trifluoroethanamine ($C_2H_4F_3N$).

3. The method of claim 1, wherein the hydrofluorocarbon etching compound is 2,2,3,3,3-Pentafluoropropylamine ($C_3H_4F_5N$).

4. The method of claim 1, wherein the DARC layer is a silicon-containing film having a formula of $SiO_xN_yH_zC_k$, wherein x ranges from 0 to 2, y ranges from 0 to 1, z ranges from 0 to about 1 and k ranges from 0 to 1.

5. The method of claim 4, wherein the DARC layer is formed of silicon oxynitride.

6. The method of claim 1, wherein the first silicon-containing layer is a silicon oxide layer and the second silicon-containing layer is a silicon nitride layer, or vice versa.

7. The method of claim 1, wherein the first silicon-containing layer is a silicon oxide layer and the second silicon-containing layer is a polysilicon layer, or vice versa.

8. The method of claim 1, wherein the hardmask layer is a thermal CVD, PECVD or spray on/spin on deposited layer of amorphous carbon or doped amorphous carbon.

9. The method of claim 8, wherein the etching gas for etching the hardmask layer is selected from the group consisting of $cC_4F_8$, $C_4F_8$, $C_4F_6$, $C_5F_8$, $CF_4$, $CH_3F$, $CF_3H$, $CH_2F_2$, $COS$, $CS_2$, $CF_3I$, $C_2F_3I$, $C_2F_5I$, $CFN$, $FNO$, $SO_2$ and combination thereof.

10. The method of claim 1, further comprising the step of depositing a polymer layer on the patterned photoresist layer, on the hardmask layer and a sidewall of the apertures when the hydrofluorocarbon etching compound is plasma activated.

11. The method of claim 1, further comprising the step of depositing a polymer layer on the patterned photoresist layer, on the hardmask layer and a sidewall of the apertures by producing —$NH_x$containing ions, where x=0-2, by plasma activation of the hydrofluorocarbon etching compound.

12. The method of claim 1, further comprising introducing an oxygen-containing gas with the hydrofluorocarbon etching compound.

13. The method of claim 12, wherein the oxygen-containing gas is selected from the group consisting of $O_2$, $O_3$, $CO$, $CO_2$, $NO$, $NO_2$, $N_2O$, $SO_2$, $COS$, $H_2O$ and combination thereof.

14. The method of claim 1, wherein the apertures extended through the alternating layers have an aspect ratio between approximately 1:1 and approximately 200:1.

15. A method for etching a structure of silicon-containing layers disposed over a substrate, the structure having a DARC layer deposited over alternating layers of silicon oxide and silicon nitride, a patterned photoresist layer formed over the DARC layer, and a hardmask layer formed in between the DARC layer and the alternating layers, the method comprising the steps of:

selectively plasma etching the DARC layer versus the patterned photoresist layer using a hydrofluorocarbon etching compound selected from the group consisting of 1,1,1,3,3,3-Hexafluoroisopropylamine ($C_3H_3F_6N$) and 1,1,2,3,3,3-Hexafluoro-1-Propanamine (Iso-$C_3H_3F_6N$) to produce apertures in the DARC layer;

selectively plasma etching the hardmask layer exposed by the apertures in the DARC layer versus the patterned photoresist layer and the DARC layer with an etching gas suitable for etching the hardmask layer to extend the apertures through the hardmask layer; and selectively plasma etching the alternating layers of silicon oxide and silicon nitride exposed by the apertures in the hardmask layer versus the patterned photoresist layer, the DARC layer and the hardmask layer using the hydrofluorocarbon etching compound to extend the apertures in the alternating layers of silicon oxide and silicon nitride, wherein the silicon oxide layer and the silicon nitride layer are etched non-selectively.

16. The method of claim 15, further comprising the step of depositing a polymer layer on the patterned photoresist layer and a sidewall of the apertures when the hydrofluorocarbon etching compound is plasma activated.

17. The method of claim 16, wherein, under plasma, 1,1,1,3,3,3-Hexafluoroisopropylamine ($C_3H_3F_6N$) includes —$NH_x$ containing ions, where x=0-2, which deposit on the patterned photoresist layer and the sidewall of the apertures while etching the DARC layer.

18. The method of claim 15, wherein the DARC layer is a silicon-containing film having a formula of $SiO_xN_yH_zC_k$, wherein x ranges from 0 to 2, y ranges from 0 to 1, z ranges from 0 to about 1 and k ranges from 0 to 1.

19. The method of claim 18, wherein the DARC layer is formed of silicon oxynitride.

20. The method of claim 15, wherein the apertures extended in the alternating layers have an aspect ratio between approximately 1:1 and approximately 200:1.

* * * * *